(12) United States Patent
Chiang et al.

(10) Patent No.: US 11,274,984 B2
(45) Date of Patent: Mar. 15, 2022

(54) PRESSURE SENSOR HAVING A LIDLESS/LAMINATE STRUCTURE

(71) Applicant: Infineon Technologies AG, Neubiberg (DE)

(72) Inventors: Chau Fatt Chiang, Melaka (MY); Paul Armand Asentista Calo, Melaka (MY); Chan Lam Cha, Melaka (MY); Kok Yau Chua, Melaka (MY); Jo Ean Chye, Penang (MY); Chee Hong Lee, Melaka (MY); Swee Kah Lee, Melaka (MY); Theng Chao Long, Melaka (MY); Jayaganasan Narayanasamy, Melaka (MY); Khay Chwan Saw, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 37 days.

(21) Appl. No.: 16/890,461

(22) Filed: Jun. 2, 2020

(65) Prior Publication Data
US 2021/0025774 A1    Jan. 28, 2021

(30) Foreign Application Priority Data
Jul. 22, 2019 (EP) .................................. 19187635

(51) Int. Cl.
*G01L 9/00* (2006.01)
*G01L 19/14* (2006.01)

(52) U.S. Cl.
CPC ............ *G01L 9/0072* (2013.01); *G01L 19/14* (2013.01)

(58) Field of Classification Search
None
See application file for complete search history.

(56) References Cited

U.S. PATENT DOCUMENTS

| 7,447,323 | B2 | 11/2008 | Mullenborn et al. | |
|---|---|---|---|---|
| 2010/0164028 | A1* | 7/2010 | Adachi | G01L 9/0042 257/419 |
| 2010/0195864 | A1 | 8/2010 | Lutz et al. | |
| 2015/0285703 | A1* | 10/2015 | Ishikawa | G01L 19/069 73/862.382 |
| 2016/0091378 | A1* | 3/2016 | Tsai | G01L 19/0092 73/728 |
| 2016/0153857 | A1* | 6/2016 | Matsuzawa | B81B 3/00 73/727 |
| 2018/0275001 | A1* | 9/2018 | Tokuda | G01L 1/2287 |

\* cited by examiner

*Primary Examiner* — Andre J Allen
*Assistant Examiner* — Jermaine L Jenkins
(74) *Attorney, Agent, or Firm* — Slater Matsil, LLP

(57) ABSTRACT

A pressure sensor includes a lidless structure defining an internal chamber for a sealed environment and presenting an aperture; a chip including a membrane deformable on the basis of external pressure, the chip being mounted outside the lidless structure in correspondence to the aperture so that the membrane closes the sealed environment; and a circuitry configured to provide a pressure measurement information based on the deformation of the membrane.

16 Claims, 23 Drawing Sheets

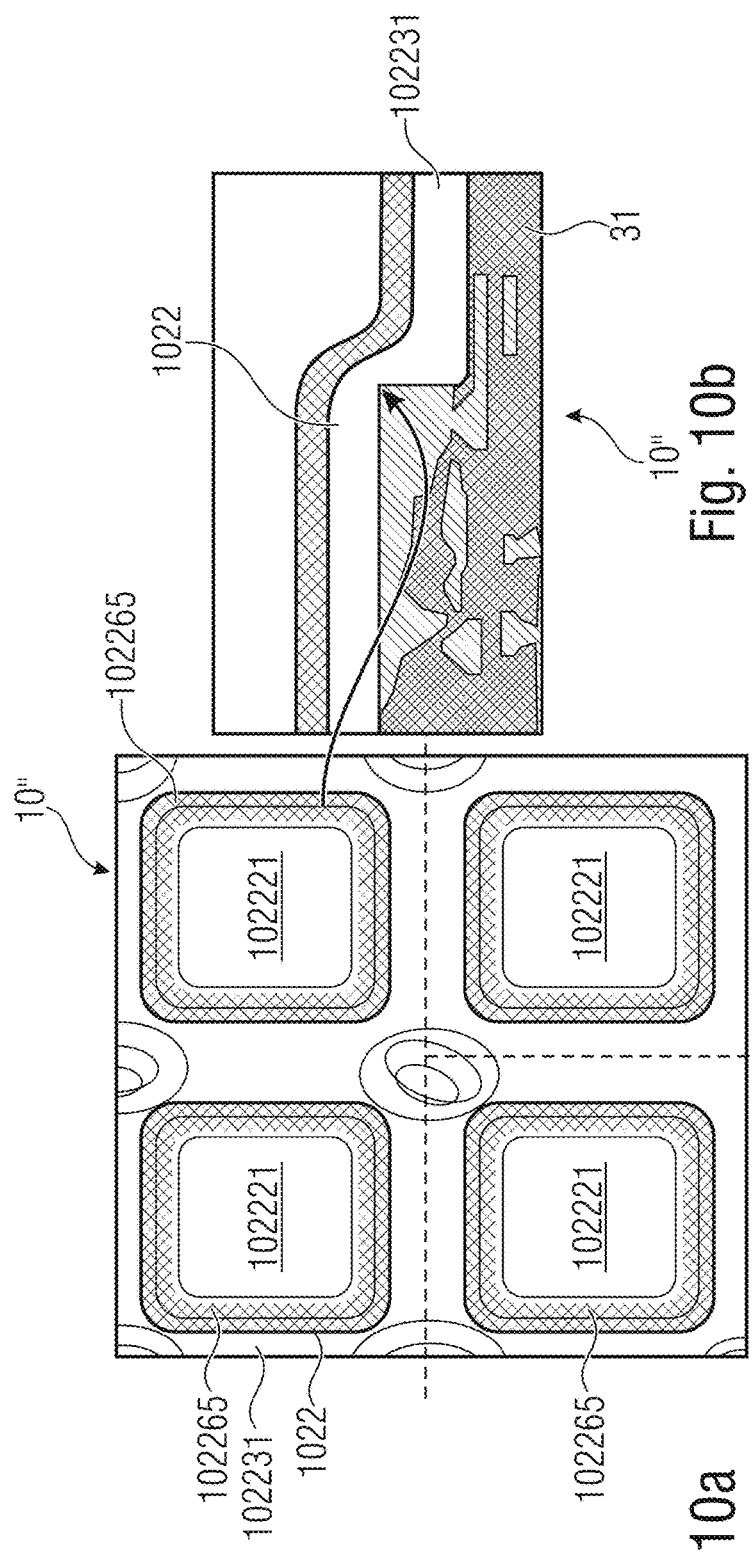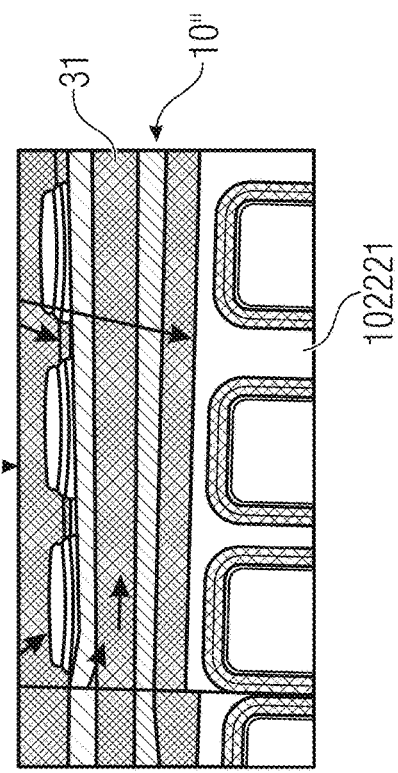

PRESSURE SENSOR HAVING A LIDLESS/LAMINATE STRUCTURE

This application claims the benefit of European Patent Application No. 19187635, filed on Jul. 22, 2019, which application is hereby incorporated herein by reference.

TECHNICAL FIELD

The present invention relates generally to a pressure sensor and to a method for manufacturing a pressure sensor.

BACKGROUND

A pressure sensor (e.g., microphone) may sense pressure (and sound), e.g., by measuring the deformation of a membrane. In examples, the pressure sensor may have an internal, sealed environment, which may permit the measurement of the pressure. Circuitry is often inserted in the sealed environment.

The sealed environment is normally enclosed by a structure, obtained with a floor wall, lateral walls and a lid. The membrane is normally mounted on a membrane chip. Both the membrane chip and the circuitry are often soldered to a wall, which is thereafter attached to the lateral walls of the structure and functions as a lid, with the membrane chip and the circuitry remaining within the sealed environment.

However, it has been noted that this configuration may have drawbacks. At first, it is not easy to attach the lid to the lateral walls of the structure, as the thickness of the lateral walls is extremely reduced and it is difficult to "guess" the position of the walls even with advanced technology. Further, such a configuration can be easily broken, as the mechanical connection between the lateral walls and the lid is intrinsically fragile.

Solutions are pursued for increasing simplicity and reliability.

SUMMARY

According to an aspect, there is provided a pressure sensor (e.g., a microphone or acoustic transducer) comprising:

a lidless structure defining an internal chamber for a sealed environment and presenting an aperture;

a chip including a membrane deformable on the basis of external pressure, the chip being mounted outside the lidless structure in correspondence to the aperture so that the membrane closes the sealed environment; and a circuitry configured to provide a pressure measurement information based on the deformation of the membrane.

As the chip is outside the structure, there is no necessity for making a lid (no lid is to be glued to the lateral walls of the structure).

In particular, the ceiling floor may be integrated in one piece with the structure, which avoids the necessity of applying an external lid.

The chip may be attached to the structure via a stable and reliable flip-chip connection, which is both a mechanical connection and an electrical connection.

A glue or a film may be applied to the ceiling wall of the structure (and in particular on the outer surface of the ceiling wall), to seal the internal environment.

The circuitry may be applied to the floor wall, which permits to save space in the floor wall.

According to an aspect, there is provided a method for manufacturing at least one pressure sensor (e.g., as above and/or below), the method comprising:

preparing a laminate structure with a cavity (e.g., chamber) fluidically communicating with the external environment through an aperture, so that the laminate structure has a circuitry applied thereto;

mounting, from an external side, a chip onto the laminate structure in correspondence to the aperture, the chip including a membrane deformable on the basis of external pressure, the membrane closing the internal environment of the cavity; and inserting sealing material so as to obtain a sealed environment within a space delimited by the membrane, the sealing material, and the laminate structure.

Accordingly, lidless structures may be obtained.

The sealing material may be applied on the external side of the ceiling walls, hence simplifying the manufacturing process (it is not necessary to glue a lid to the lateral walls of the structure).

According to an aspect, there is provided a method for manufacturing at least one pressure sensor (e.g., a microphone and/or transducer), the method comprising:

preparing a laminate structure with a cavity fluidically communicating with the external environment through an aperture, so that the laminate structure has a circuitry applied thereto;

mounting, from an external side, a chip onto the laminate structure in correspondence to the aperture, the chip including a membrane deformable on the basis of external pressure, the membrane closing the internal environment of the cavity; and applying sealing material so as to obtain a sealed environment within a space delimited by the membrane, the sealing material, and the laminate structure.

It is possible to manufacture a single structure which is the precursor of multiple structures for multiple pressure sensors. The multiple structures may be simulated, e.g., in correspondence of the lateral walls, so as to obtain a plurality of structures and/or pressure sensors.

According to an aspect, inserting sealing material may include sealing the chip to the laminate structure by glue, or other sealing material, occupying the interspace between the chip and the laminate structure.

According to an aspect, wherein inserting sealing material may include sealing the chip to the laminate structure by externally applying a film to the chip.

According to an aspect, inserting sealing material may include inserting sealing material on an external surface of a ceiling wall of the structure.

The pressure sensor may be a microelectromechanical system (MEMS).

BRIEF DESCRIPTION OF THE DRAWINGS

FIGS. 9*a*-17*c* show examples of variants of pressure sensors (e.g., microphones) and intermediate processes for manufacturing the pressure sensors;

DETAILED DESCRIPTION OF ILLUSTRATIVE EMBODIMENTS

Figure 1:
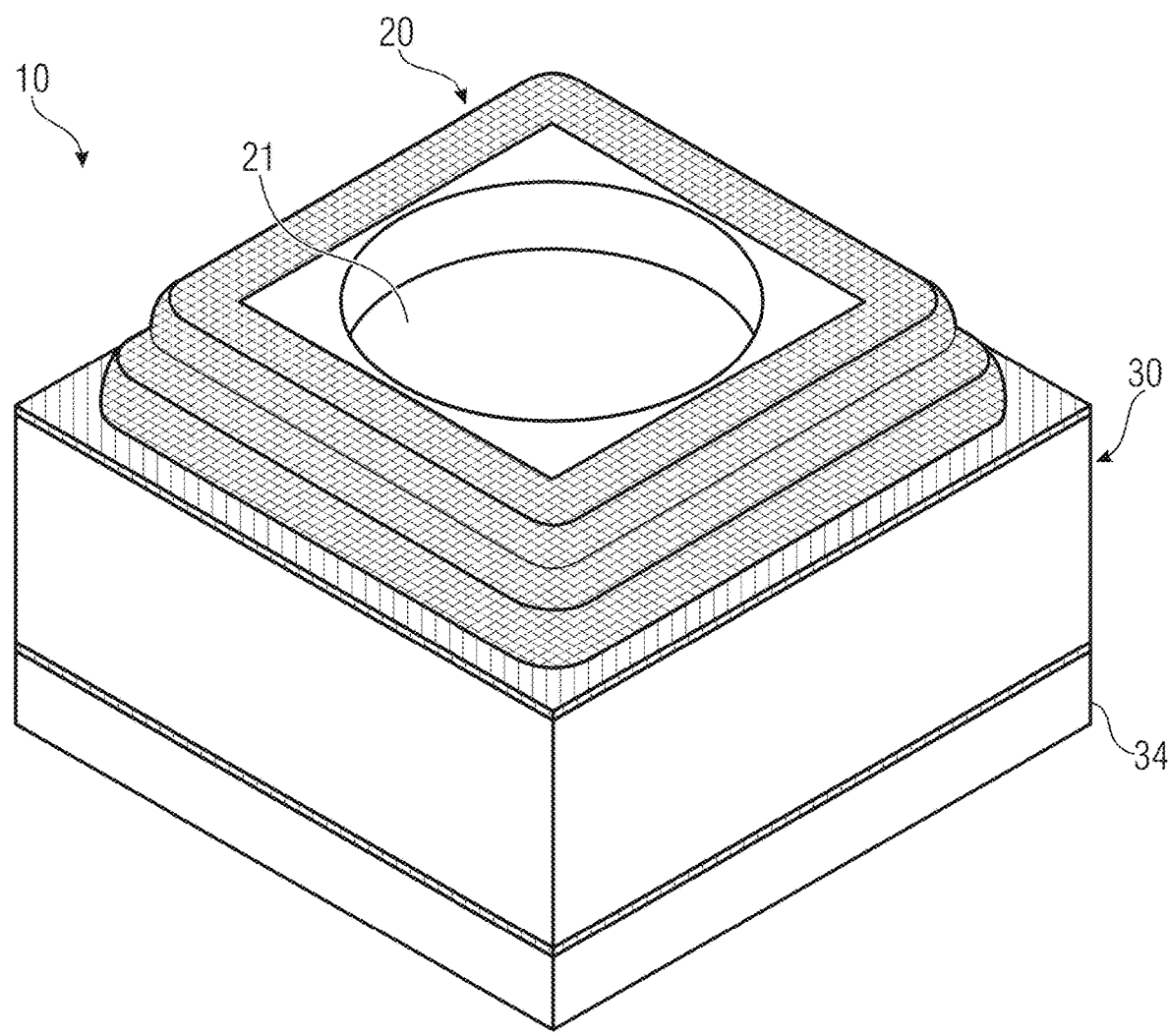
FIGS. 1-5*b* show an example of a pressure sensor (e.g., microphone)
Figure 2:
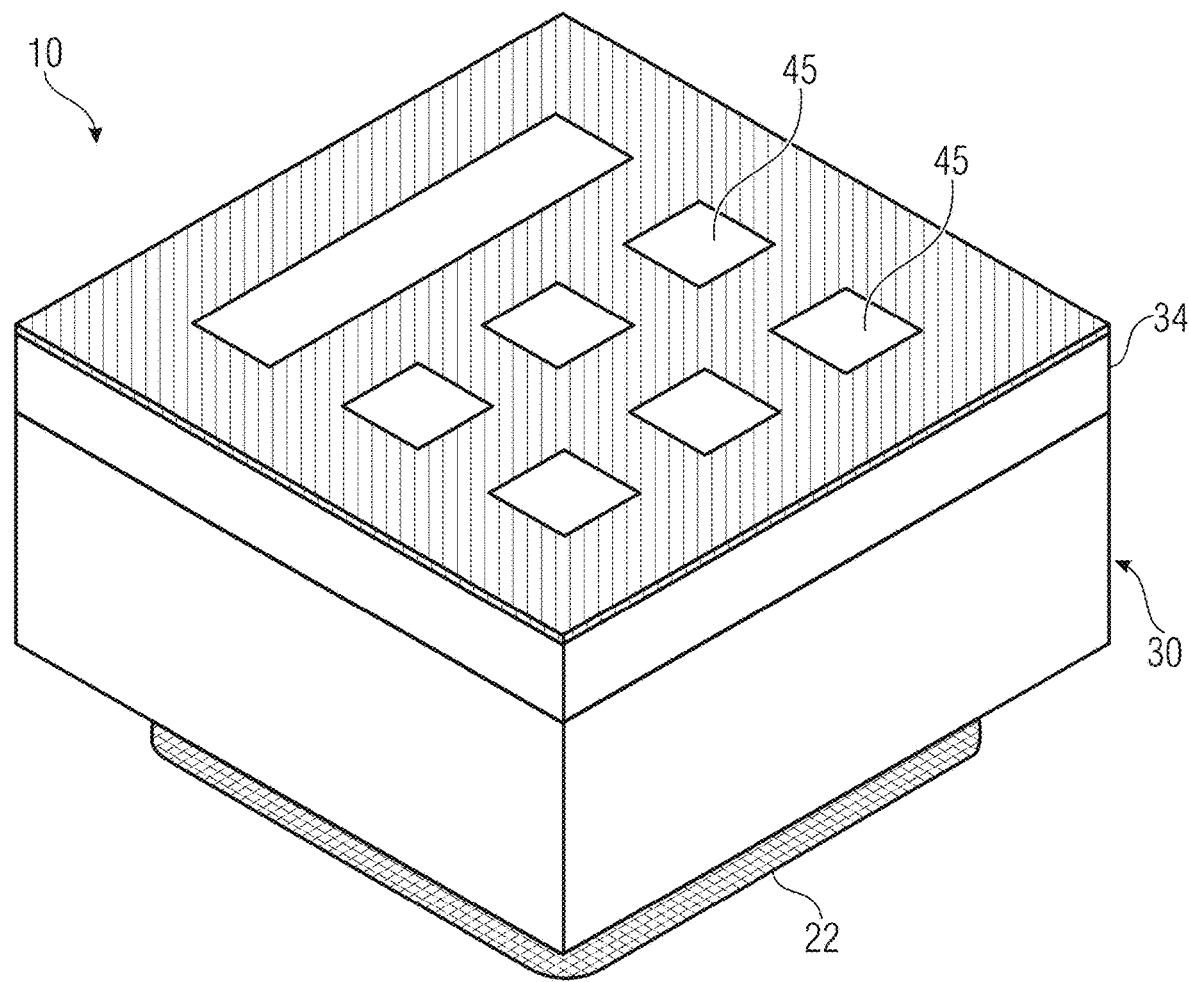
Figure 3:
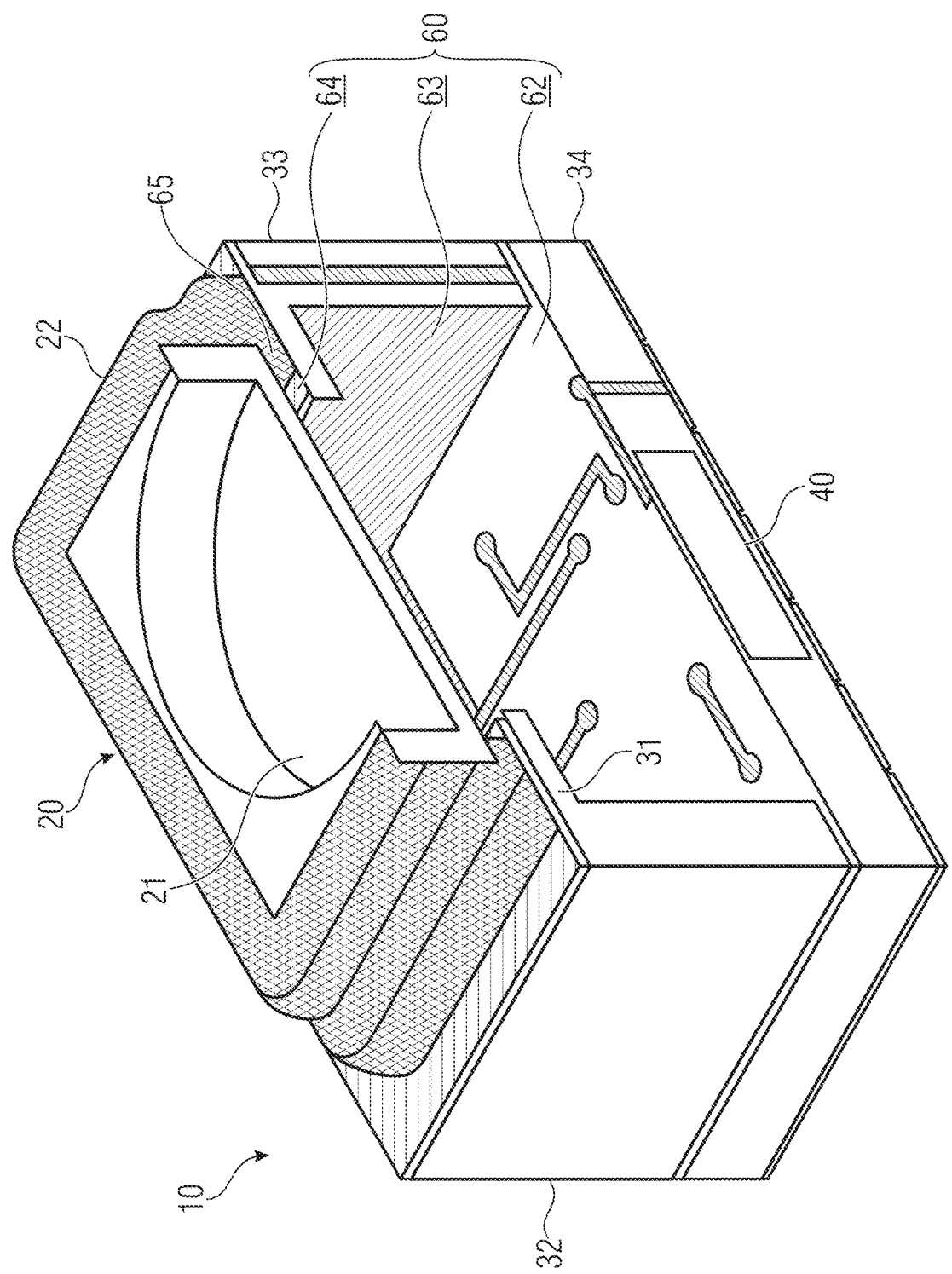
Figure 4:
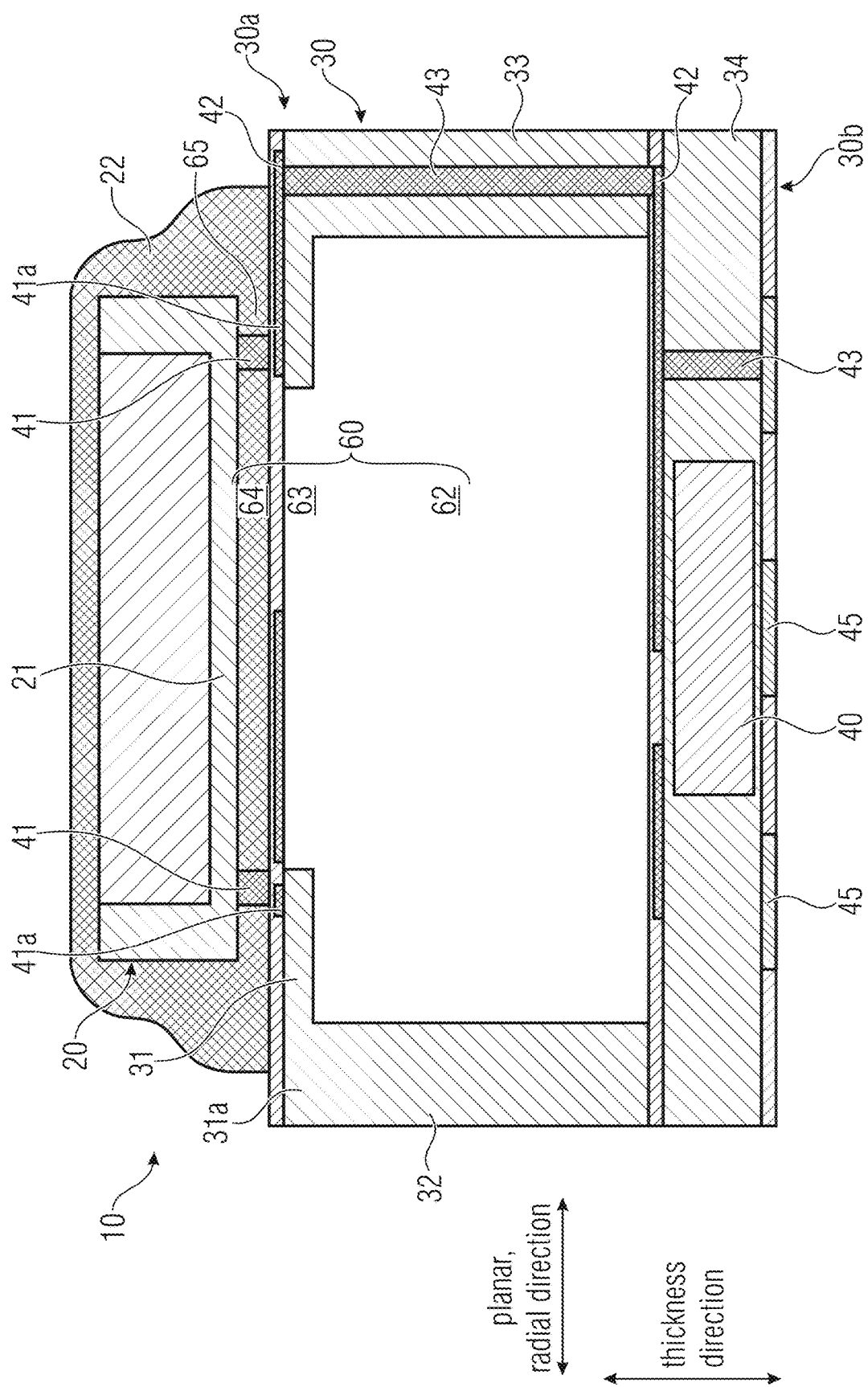
Figure 5A:
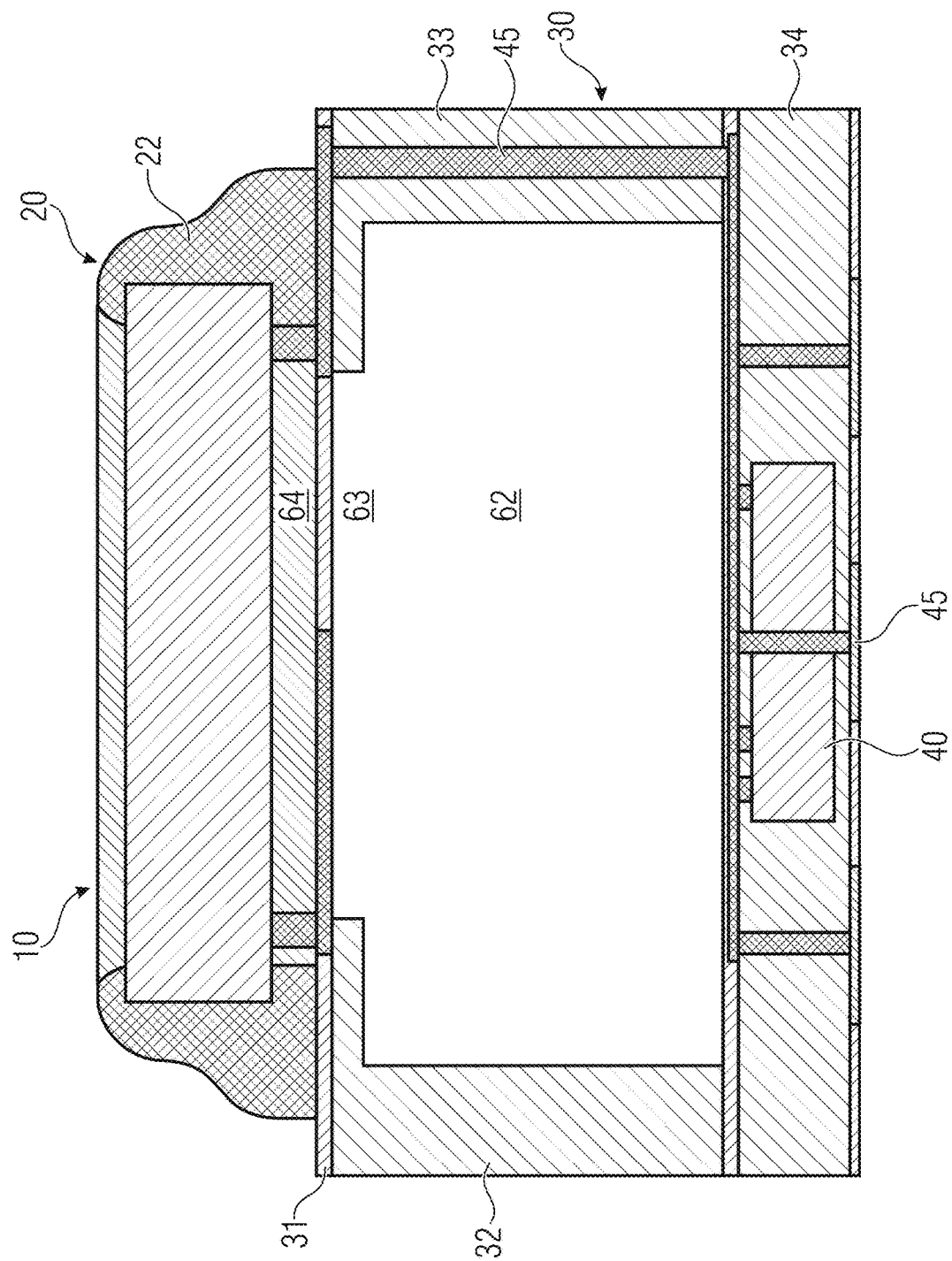
Figure 5B:
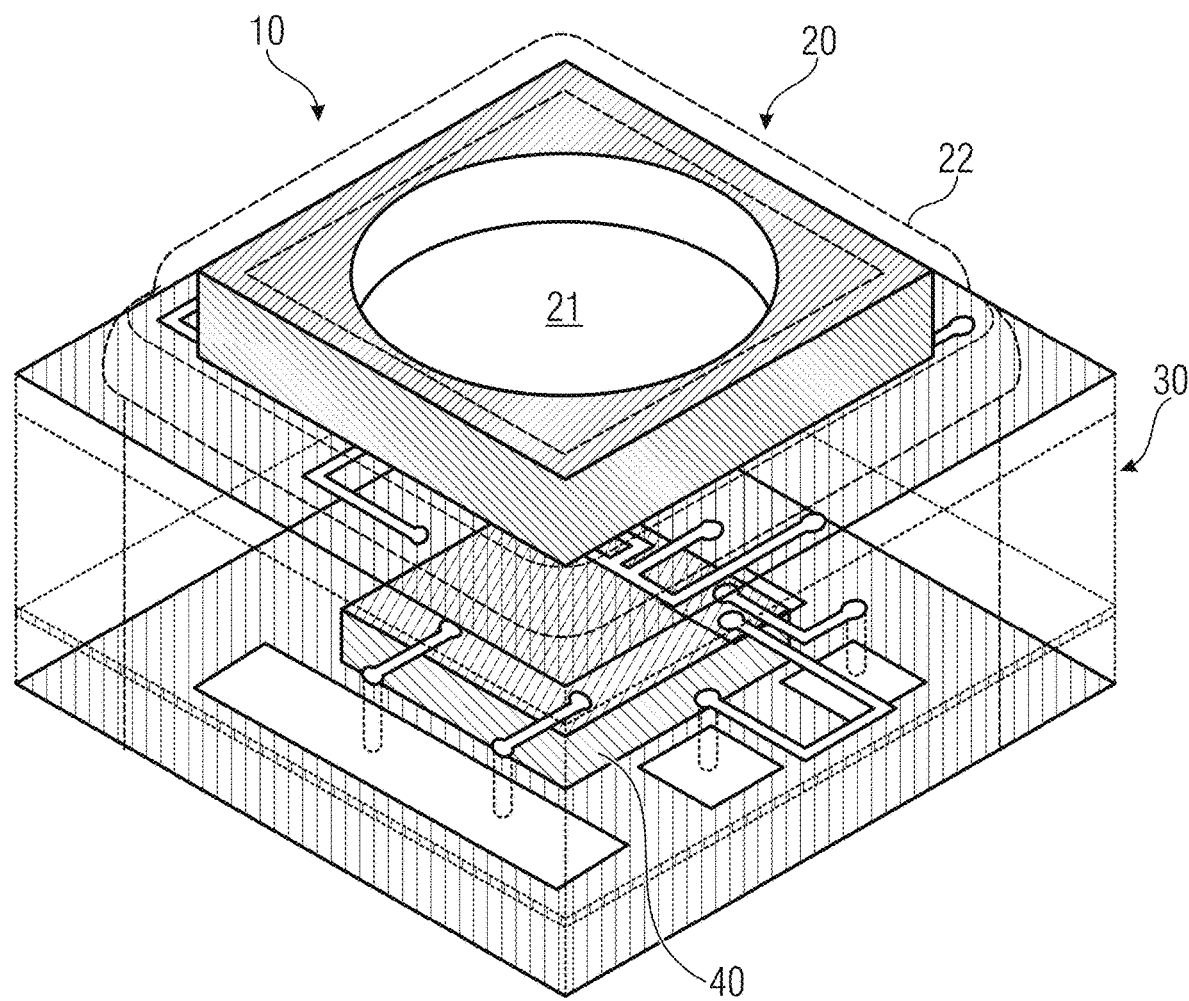
Figure 6A:
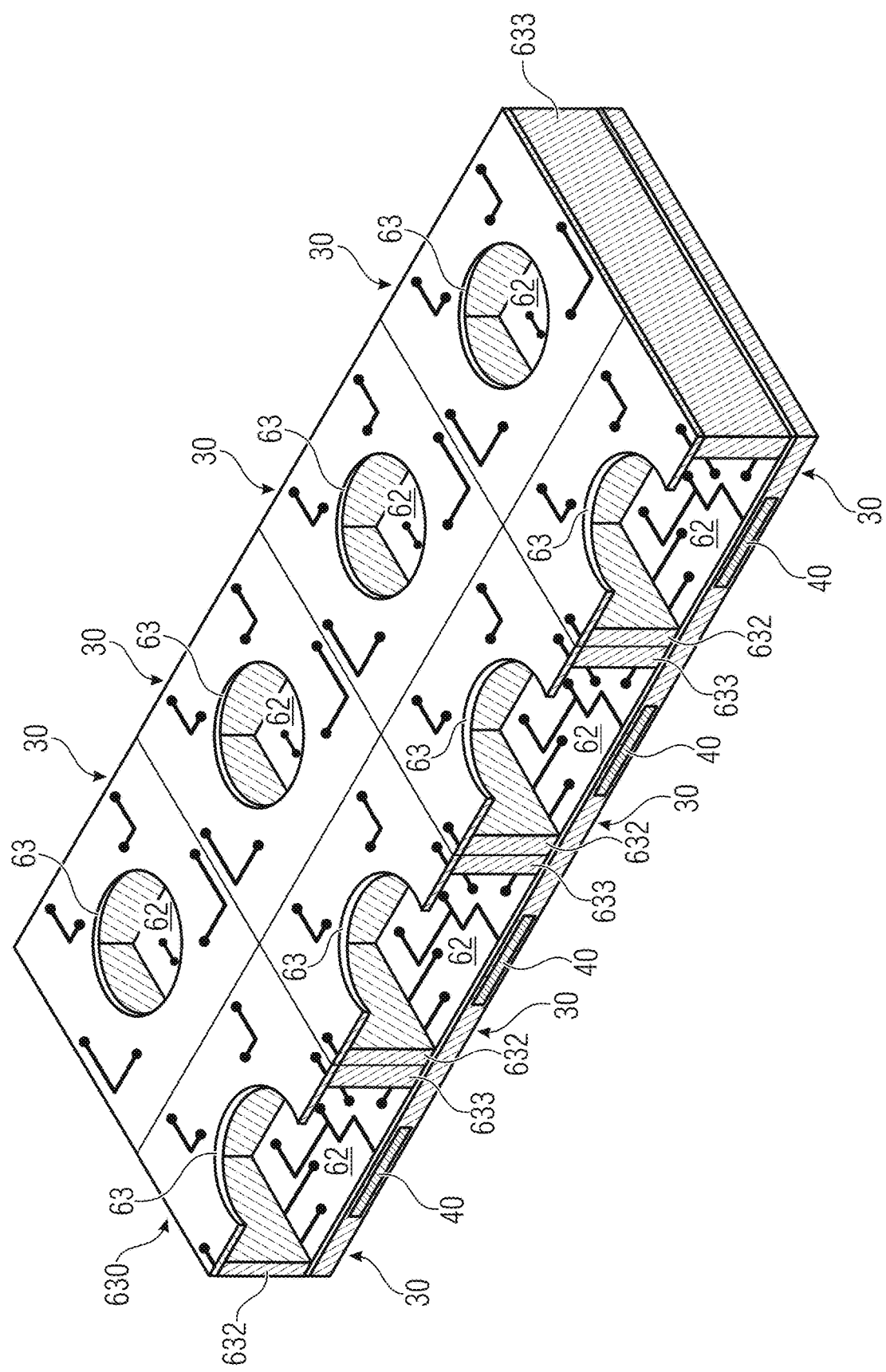
FIGS. 6*a*-8*b* show examples of intermediate steps for manufacturing pressure sensors (e.g., microphones)
Figure 6B:
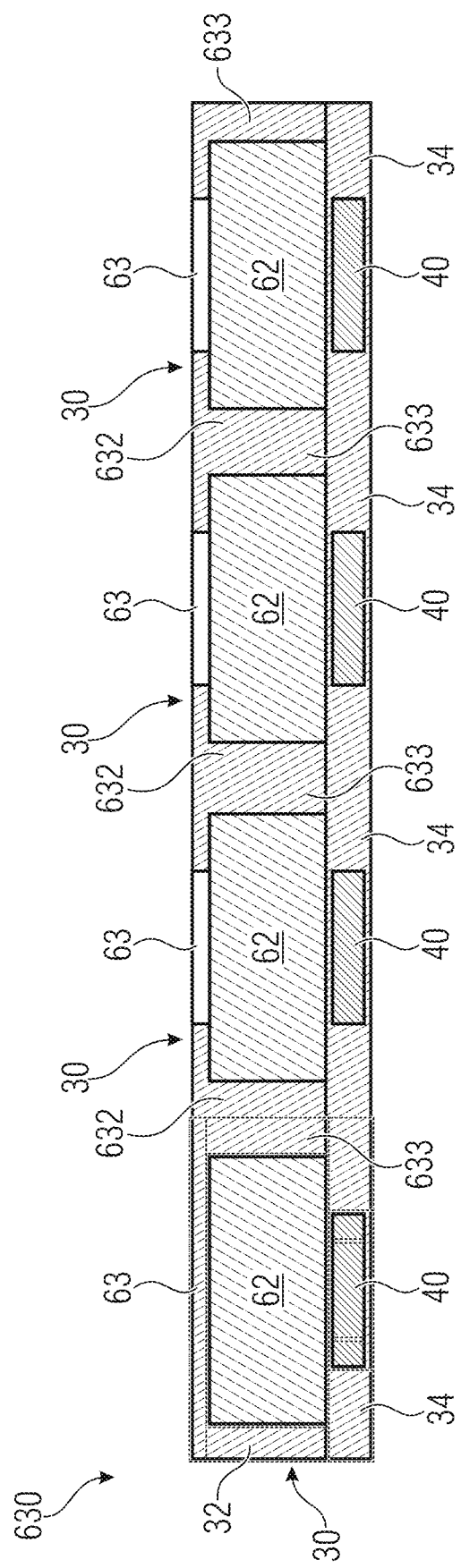
Figure 7A:
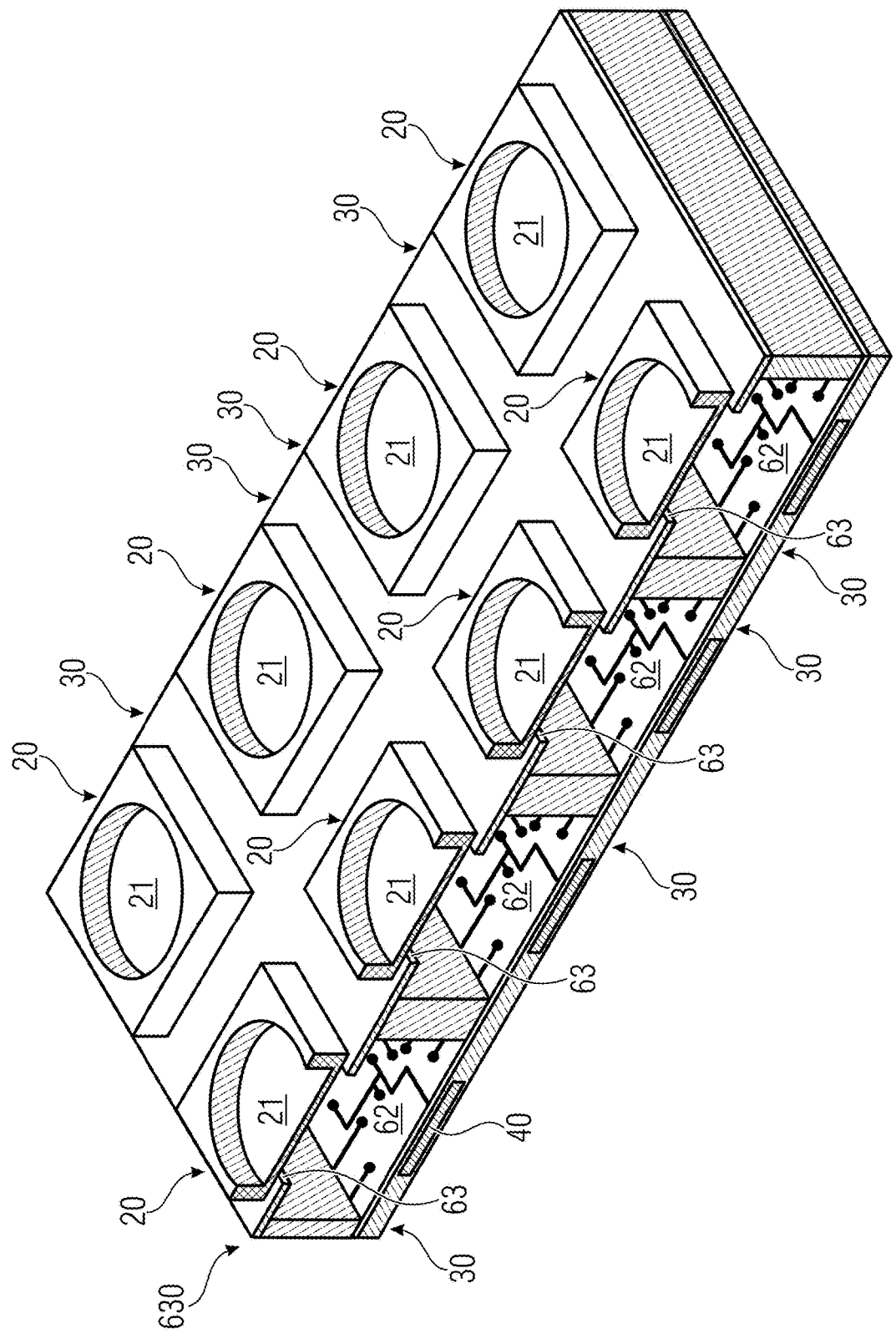
Figure 7B:
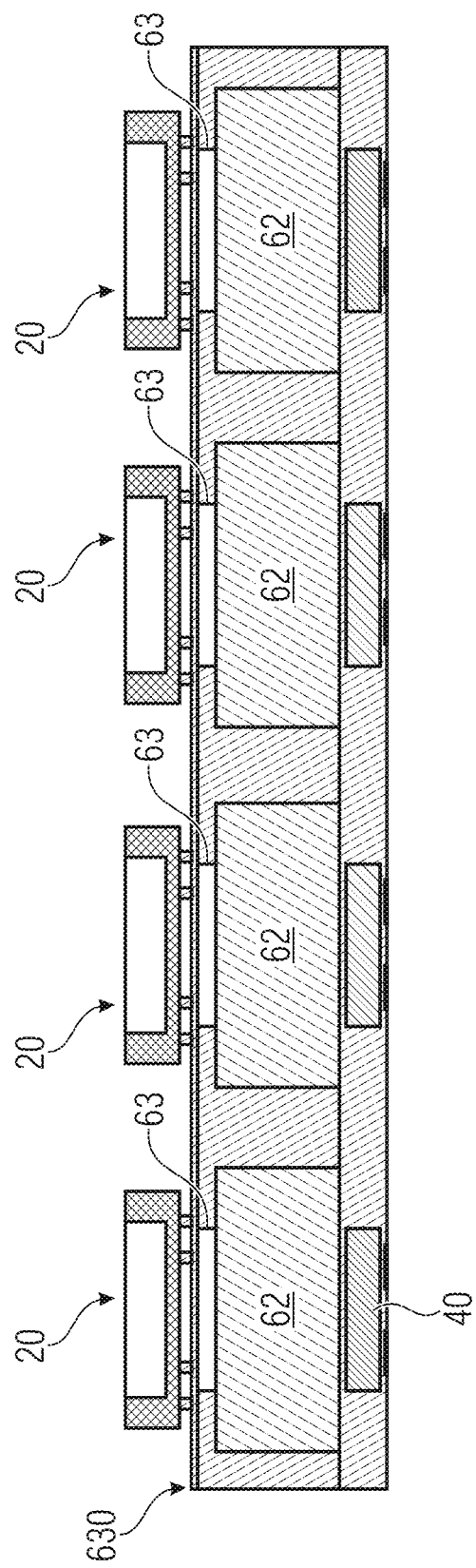
Figure 8A:
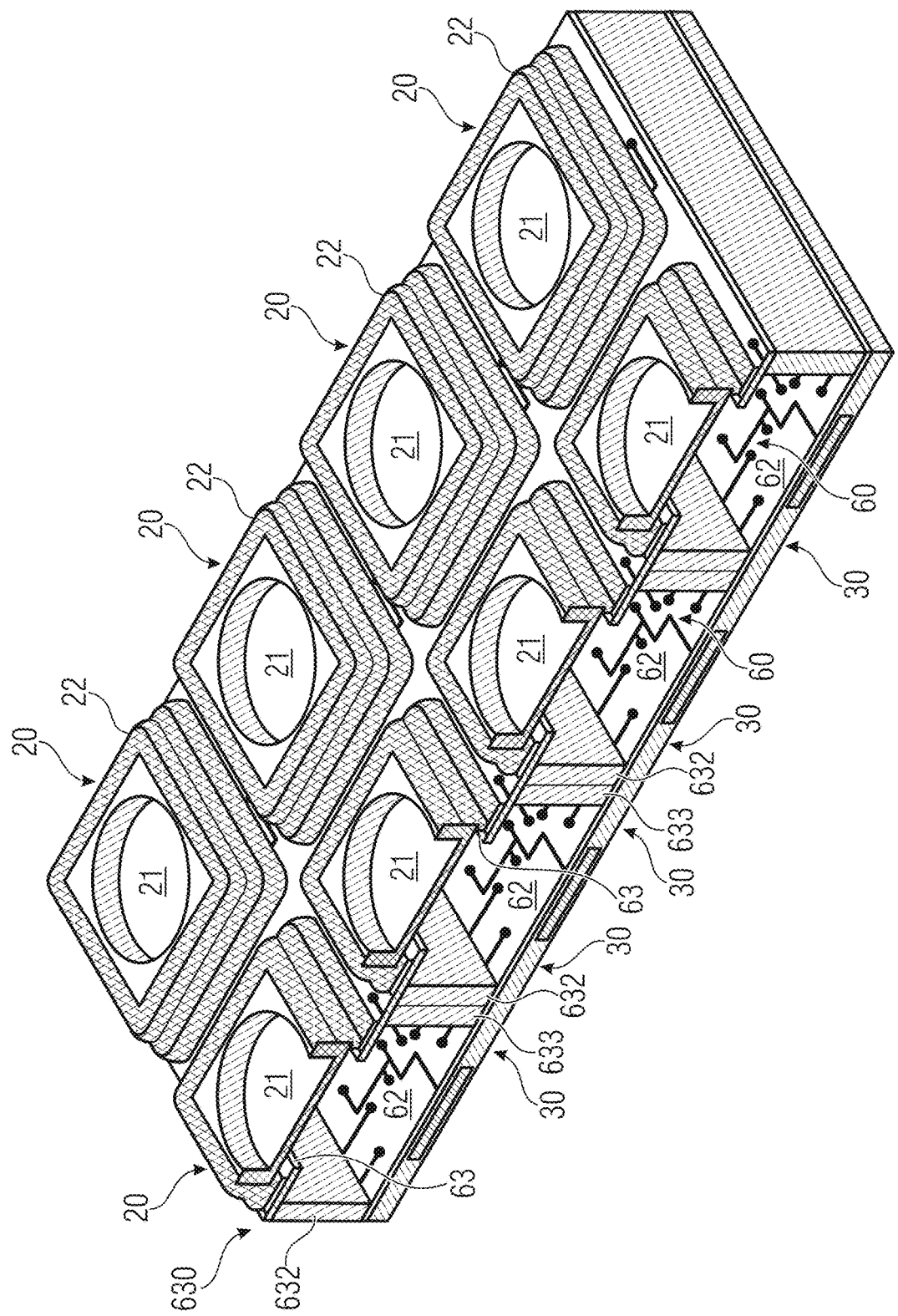
Figure 8B:
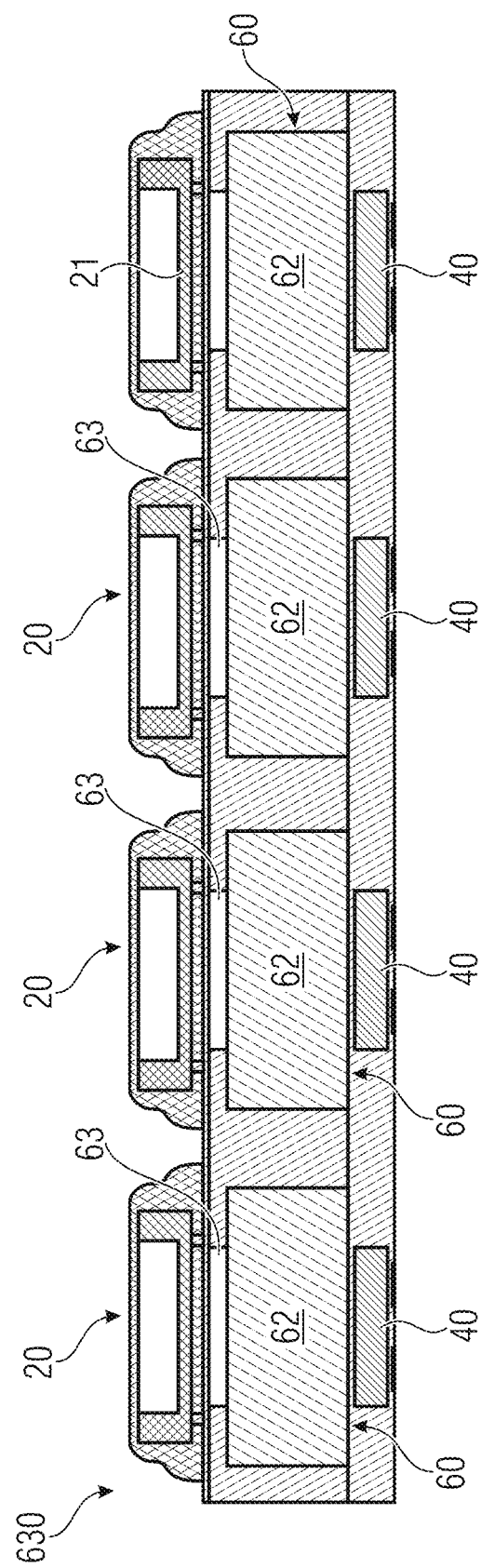

FIGS. 1-5b show an example of a pressure sensor 10. The pressure sensor 10 may be used for transducing a pressure measurement into an electric signal. The pressure measurement may be, for example, a measurement of a pressure or a measurement indicating a modification of the pressure with time. The pressure sensor 10 may be (or may be a part of) a microphone, which may therefore transduce acoustic waves (e.g., sound ultrasound, etc.) into electric signals. The pressure sensor 10 may be a microelectromechanical system (MEMS). The pressure sensor 10 may provide pressure measurement information to external devices and/or compute the pressure measurement information. The pressure sensor 10 may have planar dimensions within 1.5 mm and 2 mm (e.g., around 1.7 mm) and a thickness between 0.6 mm and 10 mm (e.g., around 0.8 mm). (The thickness in FIG. 4 is represented as the vertical dimension).

The pressure sensor 10 may include a lidless structure 30. The lidless structure 30 may be a laminate structure. The lidless structure 30 may be in synthetic material (e.g., fiber reinforced (riched) resin). The lidless structure 30 may be box-shaped. The lidless structure 30 may have a parallelepiped shape or a cylindrical shape. The lidless structure 30 may be hollow. The lidless structure 30 may, for example, present a plurality of walls 31, 32, 33 and 34 (e.g., parallel in a two-by-two fashion). For example, the structure 30 may present a floor wall 34 or circuitry-side wall 34. The floor wall 34 or circuitry-side floor wall 34 may be placed at a circuitry-side 30b of the structure 30 (e.g., back side 30b). The structure 30 may present an aperture wall 31 or ceiling wall 31, which may be placed at membrane-side 30a of the structure 30. The walls 31 and 34 may be spaced from each other through a void space (e.g., chamber or backspace 62). The floor wall 34 may be parallel to the ceiling wall 31.

The structure 30 may include at least one lateral wall (e.g., 32, 33), which may also define an interspace (e.g., chamber 62). At least two lateral walls may be parallel to each other.

In general terms, the structure 30 may define an internal chamber 62 (back space, cavity) (e.g., delimited within the walls 31-34). The structure 30, notwithstanding, may present an aperture 63. For example, the aperture 63 (e.g., positioned at the aperture side 30a) may be present in the wall 31.

The pressure sensor 10 may include a chip 20. The chip 20 may be a MEMS chip.

The chip 20 may be or include a MEMS device 21. The MEMS device 21 may provide pressure measurements operating as a variable-gap capacitor, which modifies the capacitance based on the pressure. The MEMS device 21 may be integrated in the laminate structure 30, to form a lidless package microphone.

Figure 19A:
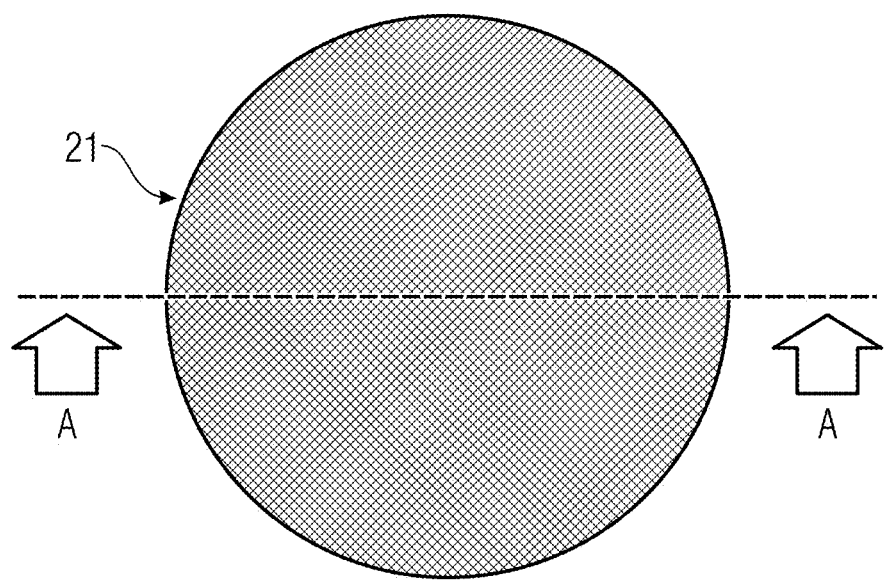
FIGS. 19a-19c show examples of components of pressure sensors.
Figure 19B:
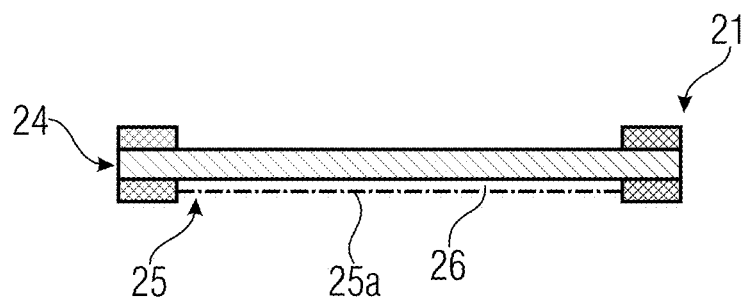
Figure 19C:
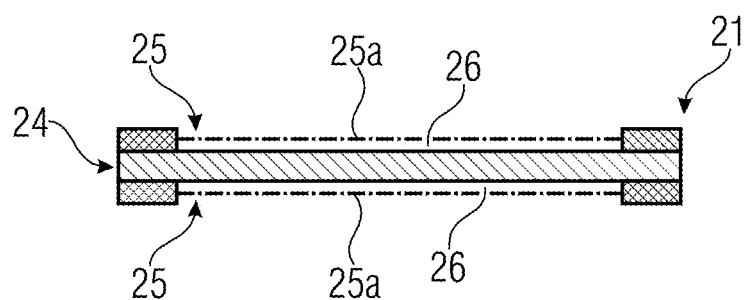

Examples of the MEMS device 21 are shown in FIGS. 19a-19c. FIG. 19a shows the MEMS device 21 (e.g., the MEMS device 21 of FIG. 1). To illustrate a first and a second variant, FIGS. 19b and 19c show two different cross-sectional views according to the line A-A of FIG. 19a. The MEMS device 21 may comprise a membrane 24 and at least one back plate 25.

The MEMS device 21 may have one back plate 25 (FIG. 19b). In some examples, the back plate 25 may be more internal than the membrane 24 (e.g., the back plate 25 may be closer to the aperture 63 than the membrane 24). In some examples, the back plate 25 may be more external than the membrane 24 (e.g., the back plate 25 may be less close to the aperture 63 than the membrane 24).

The MEMS device 21 may have two back plates 25 (FIG. 19c). In some examples, the membrane 24 may be interposed between two back plates 25. A first back plate 25 may be more internal than the membrane 24 (e.g., the first back plate 25 may be closer to the aperture 63 than the membrane 24), while a second back plate 25 may be more external than the membrane 24 (e.g., the second back plate 25 may be less close to the aperture 63 than the membrane 24).

The membrane 24 and at least one back plate(s) 25 may be separated from each other by a gap 26 interposed therebetween.

The back plate(s) 25 may be in conductor material.

The back plate(s) 25 may have through-holes for permitting the fluid communication (from the external environment or from an internal environment) to arrive to a surface of the membrane 24.

The membrane 24 may be a pressure-sensitive membrane. The membrane 24 may be in a synthetic material, e.g., Si nitrite. The membrane 24 may deform due to the pressure (e.g., acoustic pressure, such as sound, ultrasound, etc.). Different pressures may lead to different deformations (e.g., greater deformation for greater external pressure). The membrane 24 may be fixed to the structure 30, in particular in correspondence with the rim of the membrane 24. The membrane 24 may vibrate, e.g., in a fashion which is associated to acoustic waves. The membrane 24 may be in a conductor material.

The membrane 24 may form a capacitor(s) together with the at least one back plate 25 (in case of two back plates, two capacitors are actually obtained). In FIGS. 1-17c, numeral 21 may be understood as referring to the MEMS device 21 including, for example, both the membrane 24, the back plate 25, and the gap 26. The back plate(s) 25 may be fixed to the structure 30. The back plate(s) 25 may be a rigid element. By virtue of the deformation of the membrane 24, the distance (gap 26) between the membrane 24 and the back plate(s) 25 may change, hence changing the capacitance(s) of the capacitor(s) formed by the membrane 24 and the back plate(s) 25. Hence, it is possible to transduce the pressure (e.g., acoustic pressure), that has caused the deformation of the membrane 24, into an electrical signal changing with the change of the capacitance(s) of the capacitor(s).

In addition or alternative, the membrane 24 may be a resistor (in this case, the back plate may be avoided). The resistance of the resistor may change according to the deformation of the membrane, which in turn follows the pressure.

In the examples of FIGS. 19a-19c, it is possible to both measure both the resistance of the membrane 24 and the capacitance of the capacitor obtained between the membrane 24 and the backplate(s) 25. In that case, resistance and capacitance may be combined to form an impedance. By measuring the impedance associated to the membrane 24, pressure information (e.g., an electric signal representative of the acoustic waves) may be obtained.

In general terms, reference numeral 21 may be understood as referring to a membrane-based MEMS device which permits to determine pressure information on the basis of the modification of at least one electric parameter (capacitance, resistance, impedance, etc.) associated to the deformation of the membrane 24. The examples below may be understood as including at least one examples of the MEMS device 21 (including at least the membrane 24) as above, even the different elements (such as the membrane and the back plate(s)) are not shown in detail.

The chip 20 (including the MEMS device 21) may be mounted on the structure 30 so as to be outside of the structure 30. The chip 20 may be mounted from an external side of the structure 30. For example, the chip 20 can be mounted in correspondence to an external side 31a of the wall 31. The chip 20 may be outside the internal chamber 62 of the structure 30.

It has been noted that, accordingly, the operation of mounting the chip 20 onto the structure 30 can be performed more easily, while the dimension of the structure 30 (in particular the thickness of the structure 30) may be advantageously reduced.

In particular, when the aperture wall 31 is integral in one piece with the lidless structure 30 (e.g., integral in one piece with the walls 32 and/or 33) there is no need, when mounting the chip 20 onto the structure 30, for applying a lid to the structure 30. Accordingly, there is no need for glue or bond between the aperture wall 31 and the walls 32 and 33 of the structure 30.

The membrane 24 may cooperate with the structure 30 to define an internal environment 60 formed by the internal chamber 62, the space within the aperture 63, and/or a space 64 between the aperture 63 and the membrane 24 of the MEMS device 21.

A circuitry 40 may be present in the pressure sensor 10 e.g., supported by the structure 30. In the example of FIGS. 1-5b, the circuitry 40 is applied to the circuitry-side wall 34 (in this case, the circuitry 40 may be embedded, e.g., enclosed within the circuitry wall 34). The circuitry 40 may be an application-specific integrated circuit (ASIC). The circuitry 40 may be or include or be connected to a microprocessor. The circuitry 40 may be a digital device or analog device or may comprise digital portions and analog portions. The circuitry 40 may provide (e.g., in output) pressure measurement information based on the electric signal associated to the deformation of the membrane 24. The circuitry 40 may generate a digital or analog electric signal associated to the pressure, which may represent, for example, sound or ultrasound waved experienced by the sensor 10.

The chip 20 may be connected to the circuitry 40 through electric connections (e.g., 41-43).

The electric connections may include, for example, via connections 43. Via connections 43 may be obtained in the circuitry wall. Via connections 43 may be obtained in a side wall 33, wherein the vias extend through the dimension of the wall 33 along the thickness direction of the pressure sensor 10 (e.g., through 1e extension of the wall 33).

The electric connections may include planar connections 42, e.g. extending along planar directions of the walls 31 and 34 of the structure 30.

Electrical connections 41 may be present for electrically connecting the chip 20 (e.g., the membrane 24 and/or the back plate 25) to the circuitry 40 and/or output ports (e.g., pads) 45. It has been understood that the connections 41 may be flip-chip connections. Flip-chip connections, also known as controlled collapsed chip connection (C4), may be based on soldering terminals of the chip 20 to terminals 41a on the structure 30, through bumps that have been deposited onto the terminals 41 and/or 41a. Accordingly, the chip 20 may not only be electrically connected to the circuitry 40, but the chip 20 is also steadily mechanically fixed to the structure 30. This is particularly advantageous, since the chip 20 is mounted from outside. Accordingly, an increased simplicity manufacturing is obtained.

In order to seal the environment 60 within the pressure sensor 10, a sealing technique may be used. For example, glue 22 (or a film) or another sealing component may be used to occupy the interspace 65 between the chip and the structure 30. The glue 22 may be made of a thermoset material. The glue 22 may be made of an epoxy resin with filler filled. The interspace 65 may be understood as being replenished by a portion of the glue 22 (or the film) which externally surrounds (in a radially, planar direction) the interspace 64 between the MEMS device 21 and the aperture 63. The sealed interspace 65 may have a radial extension which is greater than the radial extension of the aperture 63, so as to seal the environment 60. By means of the glue 22 or film or other sealing material, the closed environment 60 (formed by the elements 62, 63, and 64).

Because of the seal, no fluid communication is present between the sealed environment 60 and an external environment. Accordingly, the gas that is contained within the sealed environment 60 is trapped within the sealed environment 60 and cannot flow outside, while gas in the outside environment cannot flow into the sealed environment 60. In some examples, the internal pressure of the sealed environment 60 may be a reference pressure, useful for obtaining reliable pressure measurement information following the deformation of the membrane 24.

As can be seen from FIG. 4, the volume occupied by the glue 22 or film or other sealing element may take a space which is greater than the sealing interspace 65 occupied by the glue 22. However, this is not a problem, as the space occupied by the glue 22, which is external to the structure 30, does not increase the extension of the pressure sensor 10 too much (and, in particular, not excessively in the thickness direction). In particular, when the radial extension of the chip 20 is less than the radial extension of the structure 30 (e.g., the extension of the walls 31 and/or in the planar direction), the glue 22 may occupy the external, circumferential space around the chip 20 without causing troubles or without increasing the thickness direction of the pressure sensor 10. The glue 22 or the covering film or another sealing material can also contribute in electrically isolating electric connections (e.g., connections 41 and/or 41a, and/or 42) which otherwise would be exposed. Hence, beside the sealing effect, also an appropriate electrical insulation is achieved.

Figure 9A:
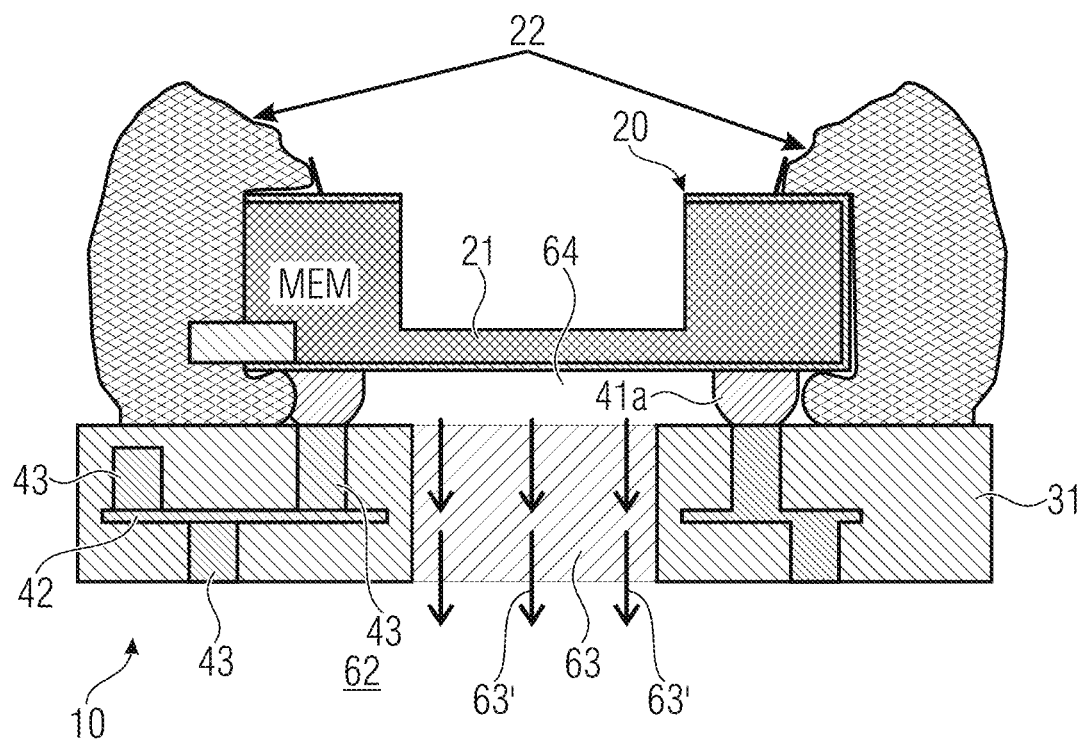

FIG. 9a shows an example of the pressure sensor 10, in which only some parts are depicted. The arrows 63' in correspondence to the aperture 63 refer to the fluid communication between the spaces 64, 63, and 62.

Figure 9B:
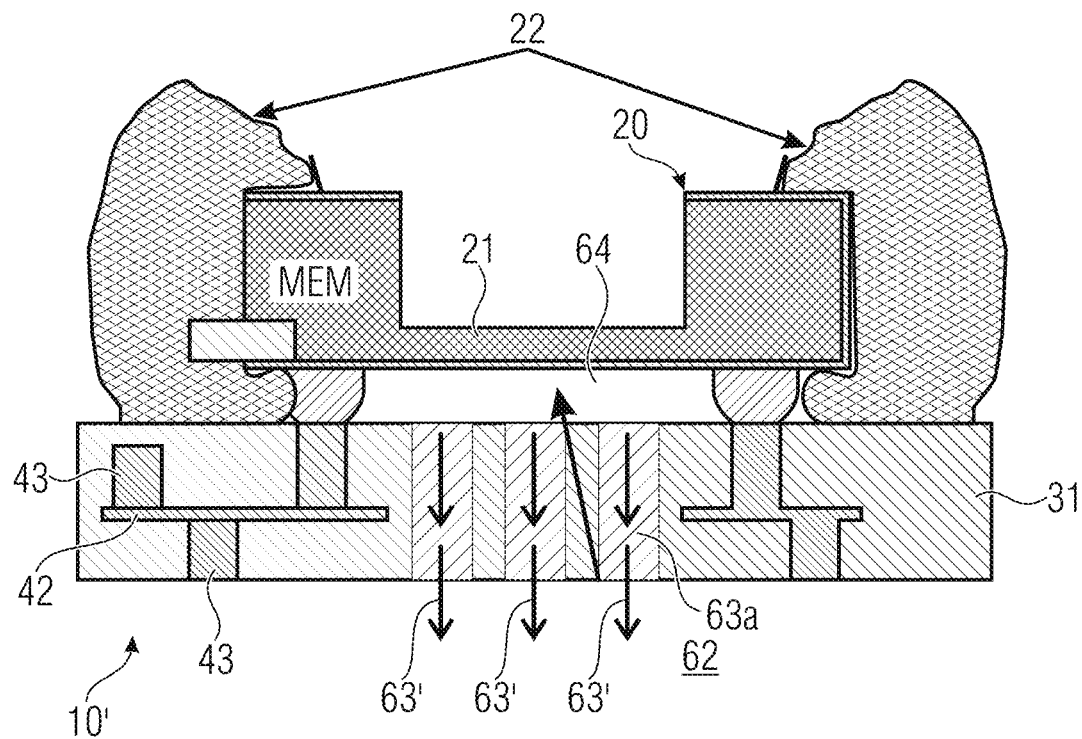

FIG. 9b shows a variant of a pressure sensor (e.g., microphone and/or acoustic transducer) 10' in which the aperture is a multiple aperture (e.g., plurality of through-holes 63a, extending like vias along the thickness direction, hence permitting a fluid communication, indicated by arrows 63', between the space 64 and the chamber 62).

Figure 12:
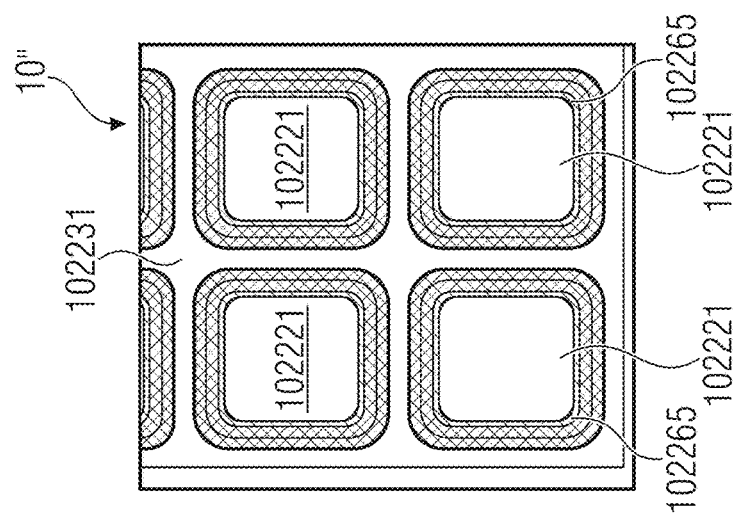
Figure 11A:
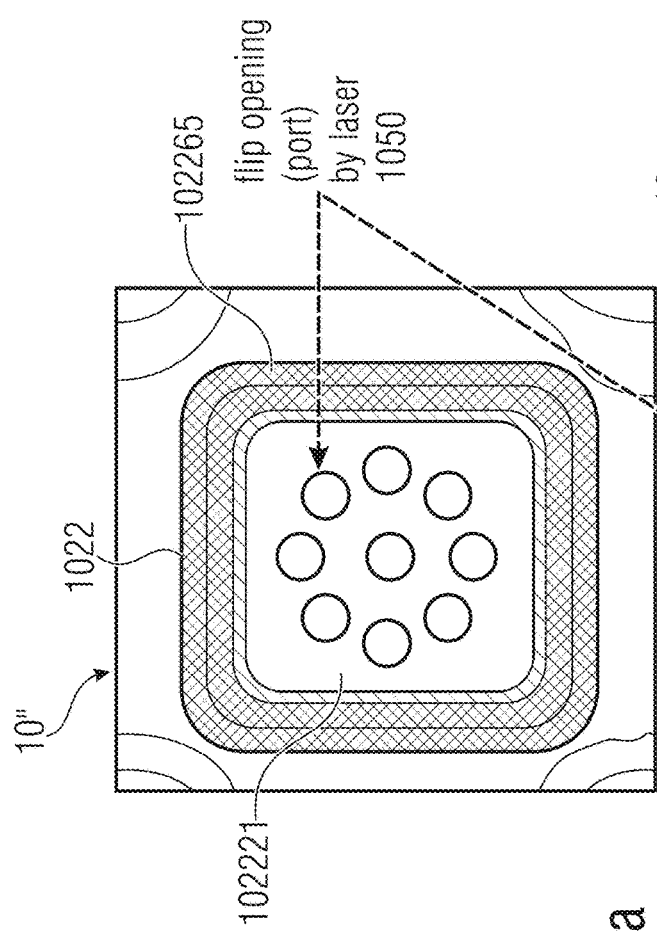
Figure 11B:
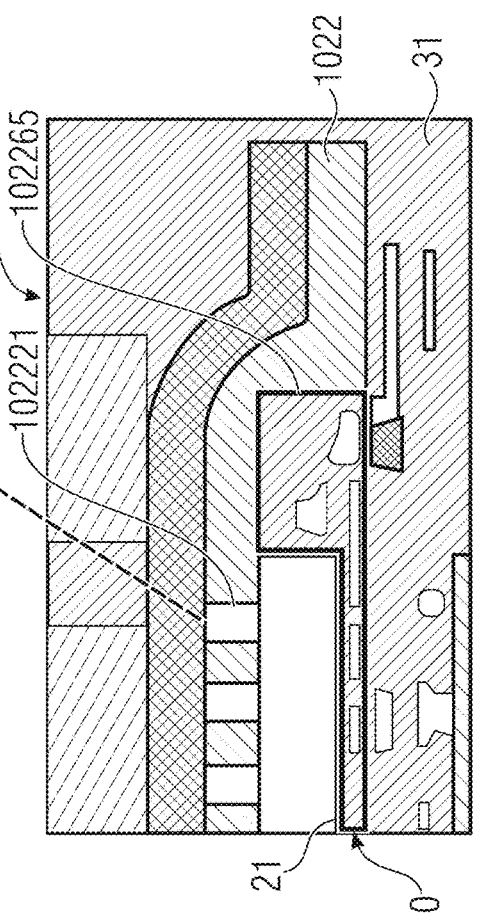

FIGS. 10-12 show a variant of a pressure sensor (e.g., microphone and/or acoustic transducer) 10" in which a film 1022 is placed on the structure 30 (e.g., on the ceiling wall 31). The film 1022 may be in epoxy or, more in general, in synthetic material. The film 1022 may be made of resin base or thermoset material. The film 1022 may include at least one of:

a ceiling-wall portion 102231 on (or over) the ceiling wall 31;

a MEMS device portion 102221 on (or over) the MEMS device 21;

a mounting portion 102265 connecting (e.g., continuously) the ceiling-wall portion 102231 with the MEMS device portion 102221.

The film 1022 may seal the closed environment 60 and operate like the seal 22.

Flip opening ports 1050 may be operated to the film 1022 (e.g., to the MEMS device portion 102221), e.g., by laser cutting. Accordingly, pressure change from ambient can be transferred to the MEMS device 21.

Figure 13:
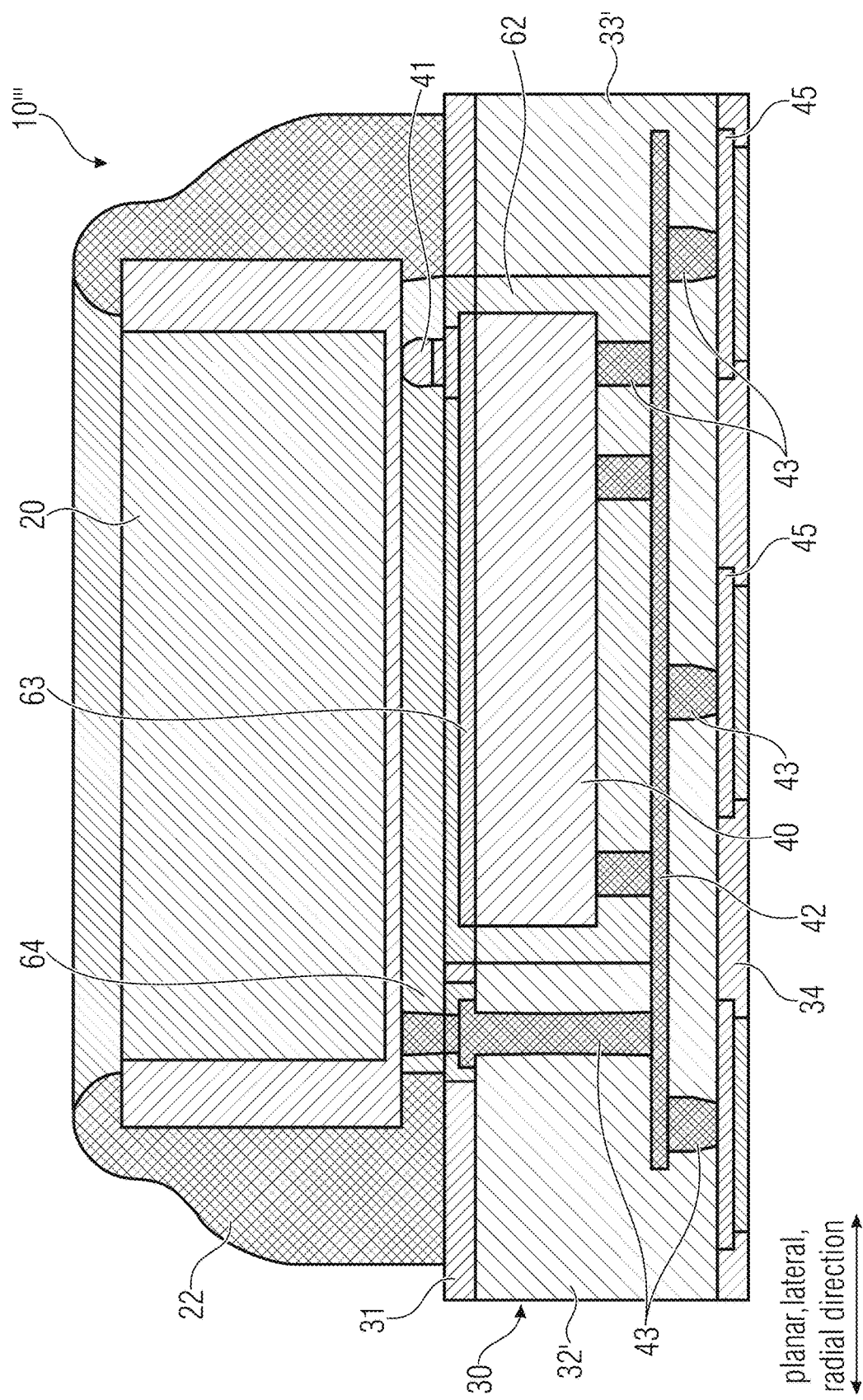

FIG. 13 shows a variant of a pressure sensor (e.g., microphone and/or acoustic transducer) 10''' showing the chip (e.g., MEMS chip) 20 and the circuitry 40, which has aspects which may be implemented independently from each other. A first aspect is that connections 41 may be implemented directly between the chip 20 and the circuitry 40, e.g., through a flip-chip connection. A second aspect (that may be combined with the first aspect) is that the circuitry 40 may be within the chamber 62, not enclosed in the floor wall 34. The circuitry 40 may be fixed to the floor wall 34, e.g., through flip-chip connection or through via connections, e.g., to arrive at output ports (e.g., pads) 45. Here, the wall(s) 32' and 33' may be massive, in the sense that the chamber 62 is obtained in a portion which has a planar (e.g., lateral, radial) dimension which is less than 60% of the planar (e.g., lateral, radial) dimension of the structure 30. Accordingly, the structure 30 has here a massive shape, which increase robustness.

Figure 14:
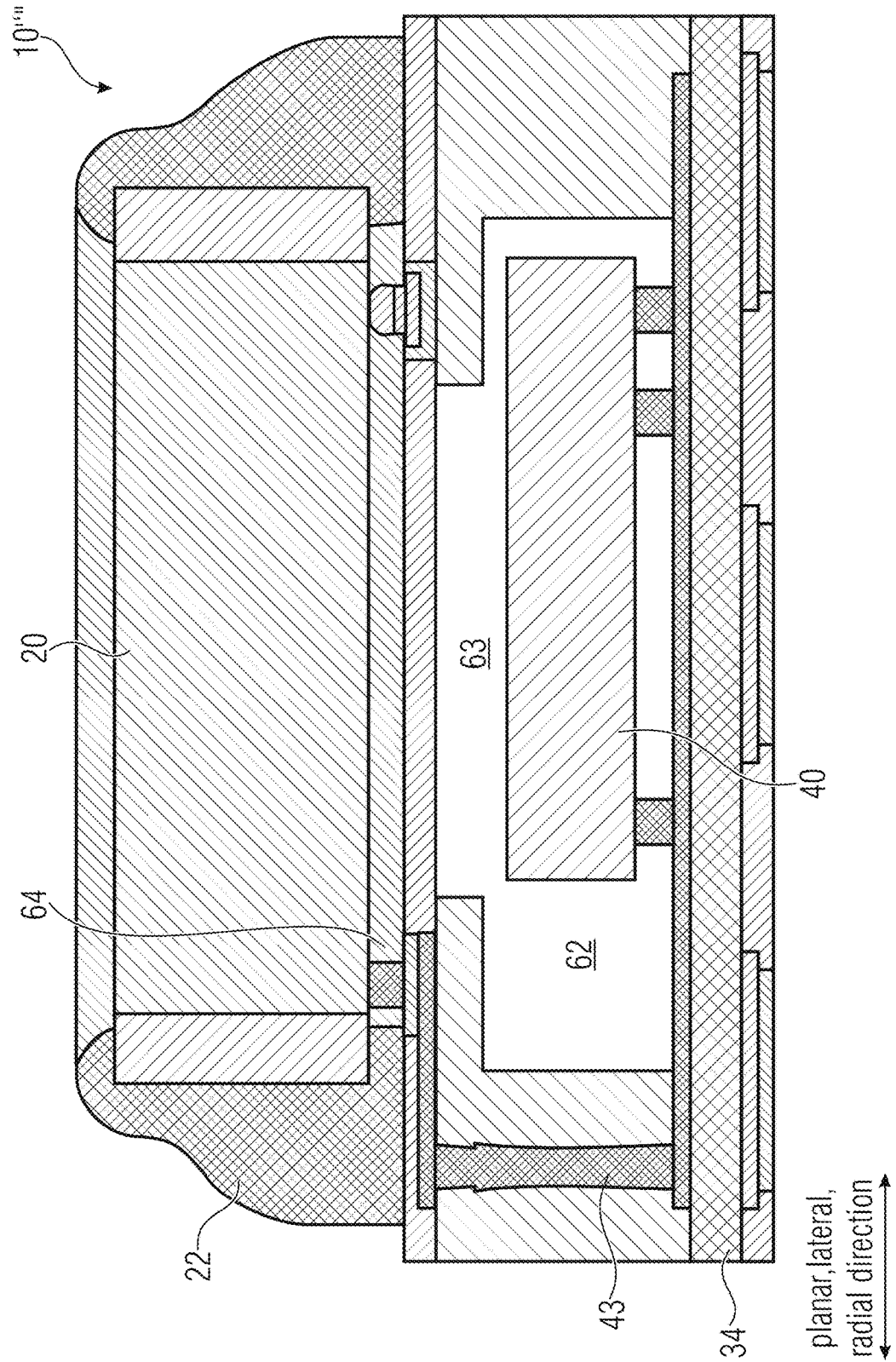

FIG. 14 shows a variant of a pressure sensor (e.g., microphone and/or acoustic transducer) 10'''' in which the chamber 62 has a planar (e.g., lateral, radial) dimension which is larger than the planar (e.g., lateral, radial) dimension of the aperture 63 (contrary to FIG. 13, where the chamber 62 has a planar dimension which is the same of the planar dimension of the aperture 63).

Figure 15:
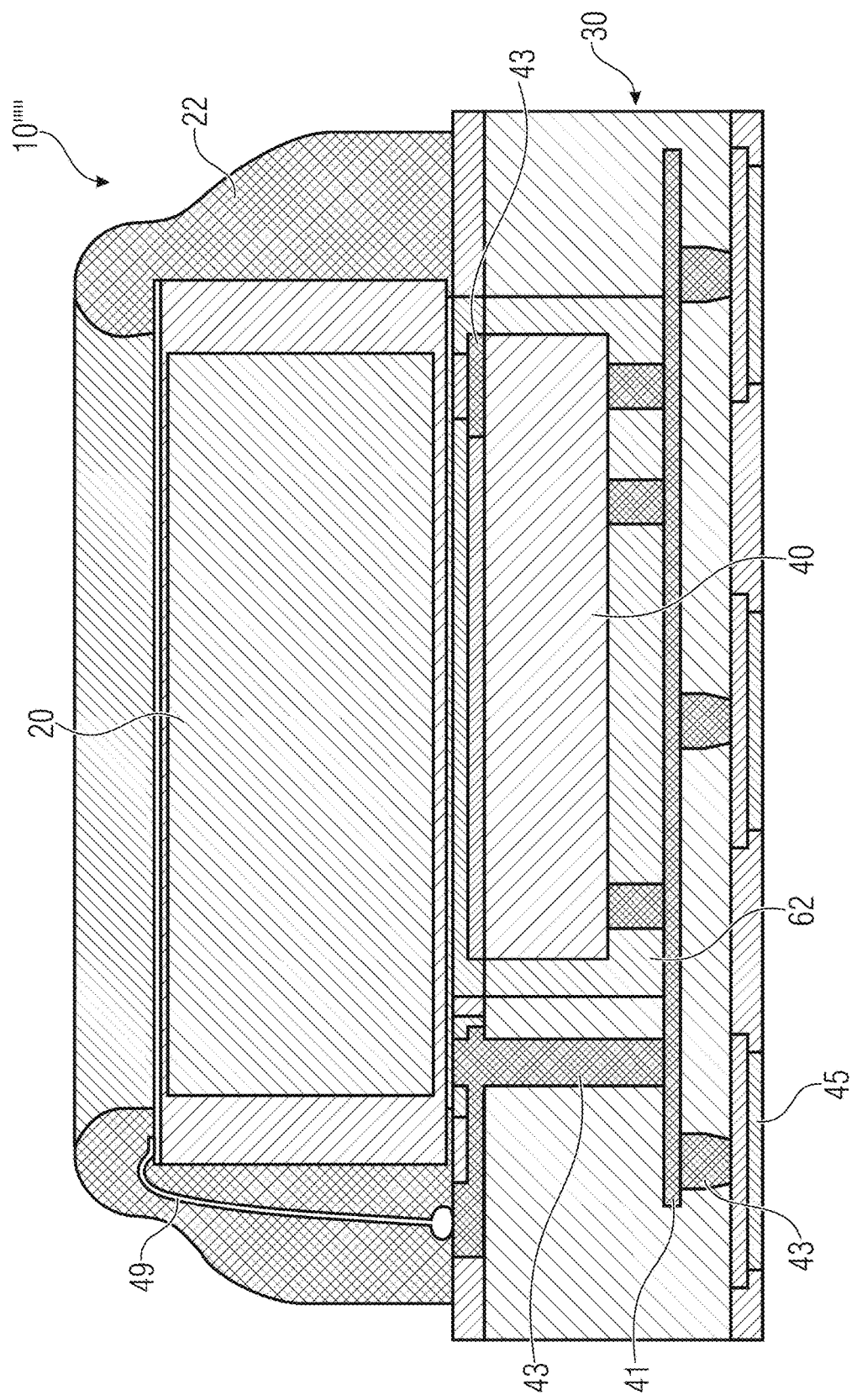

FIG. 15 shows a variant of a pressure sensor (e.g., microphone and/or acoustic transducer) 10'''' in which an electrical connection between the chip (e.g., MEMS chip) 20 and the circuitry 40 and/or at least one output port (pad) 45 is obtained through a wire 49. Even though the wired connections are in general less reliable than flip-chip connections, this is not a concern, as the wire 49 may be simply embedded in (e.g., enclosed in, e.g. completely covered by) the sealing material 22. Therefore, while the stability and the insulation of the electrical connection are guaranteed, the chip 20 may be glued to the structure 30 only by relying on the glue 22 (hence simplifying the manufacturing process). In any case, it is possible to increase the number of electric connections without performing too many flip-chip connections.

Figure 16A:
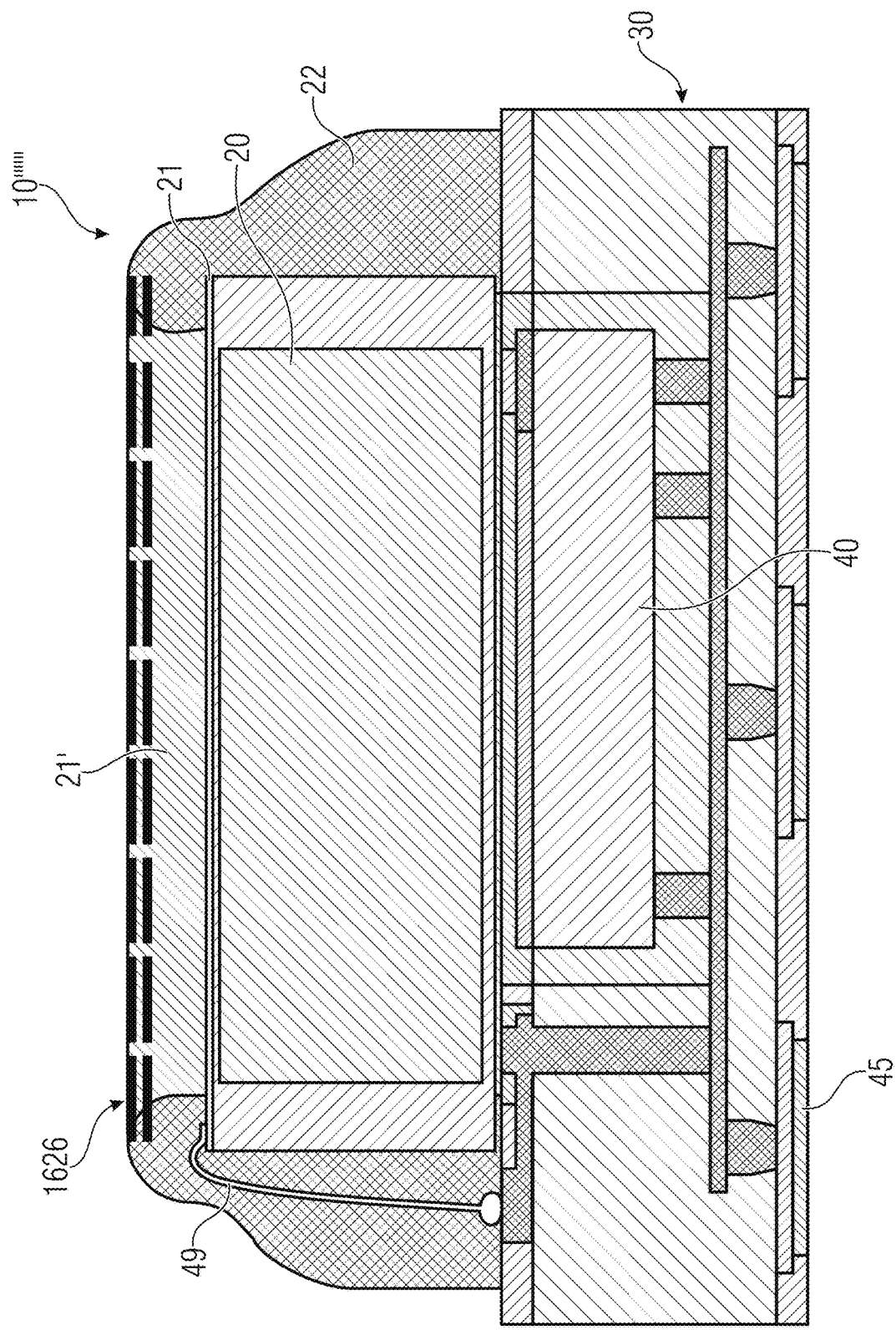
Figure 16B:
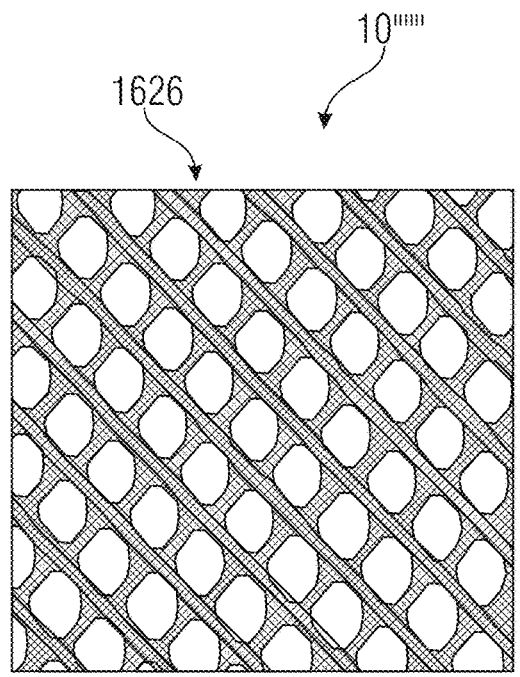

FIGS. 16a and 16b show a variant of a pressure sensor (e.g., microphone and/or acoustic transducer) 10''''' in which a protective mesh cover 1626 of a reticular shape is applied over the MEMS device 21. The protective cover 1626 may be in metal material. The protective cover 1626 may be in non-metal material. The protective cover 1626 may be separated from the MEMS device 21 by a gap 21'. The protective mesh cover 1626 may protect the membrane 24 from big particle drops.

Figure 17A:
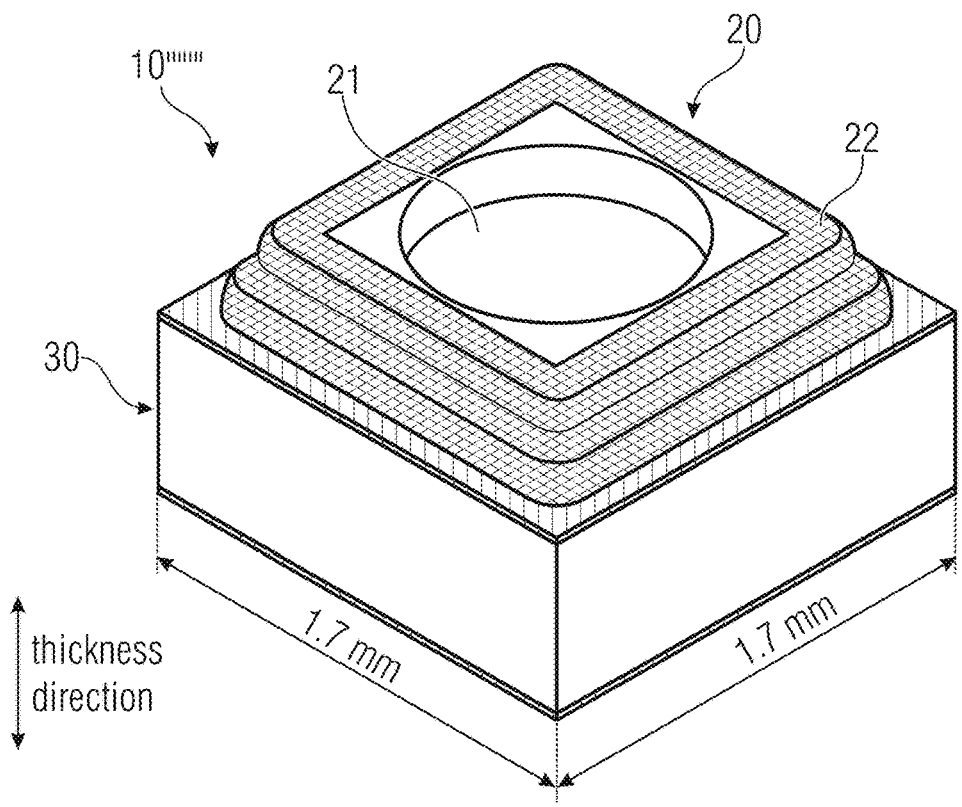
Figure 17B:
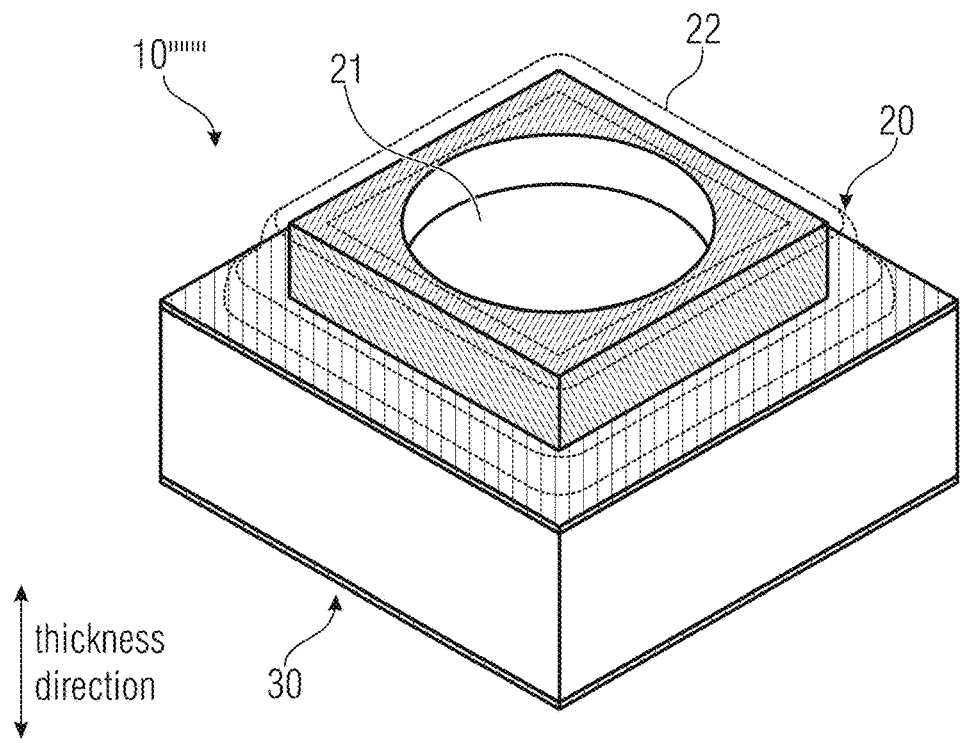
Figure 17C:
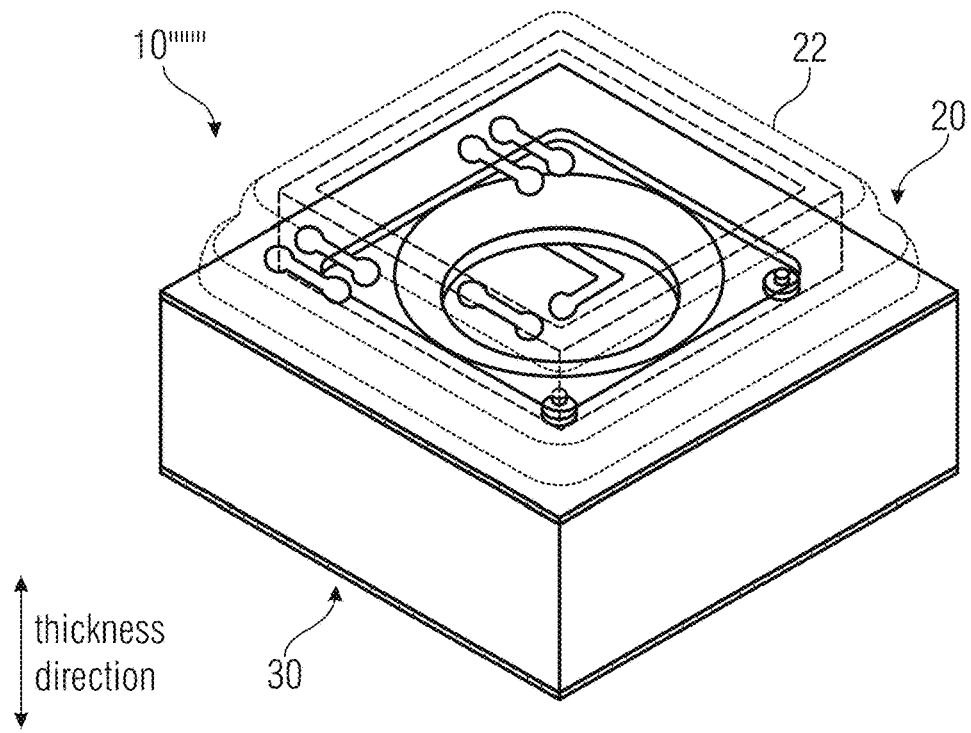

FIGS. 17a-17c show another example of pressure sensor (e.g., microphone and/or acoustic transducer) 10''''''. As can be seen, the structure 30, in the thickness direction, may have an extension which is similar to that of the chip (e.g., MEMS chip) 20.

Figure 18:
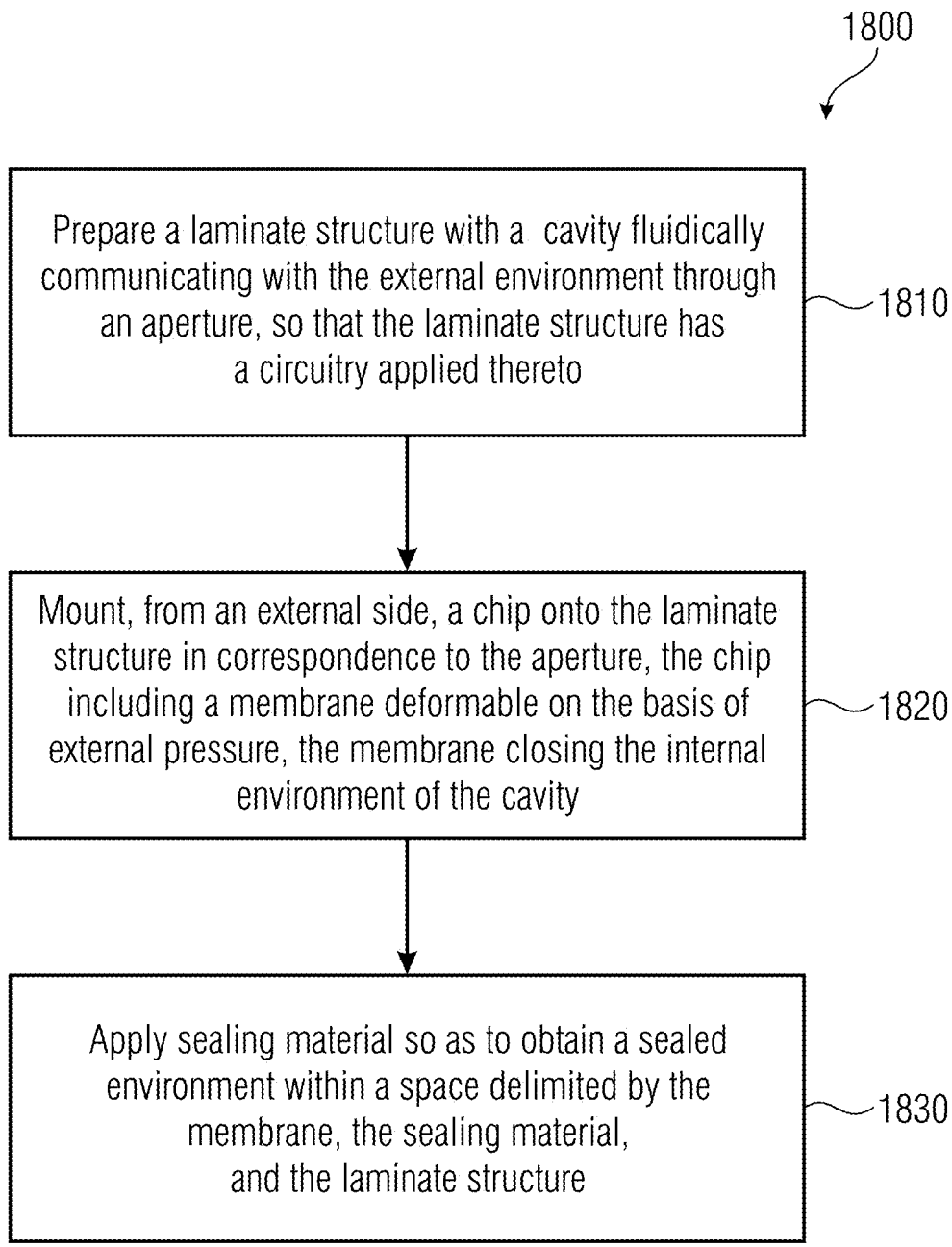
FIG. 18 shows a method for manufacturing at least one pressure sensor.

A manufacturing method 1800 (shown in FIG. 18) is explained with particular reference to FIGS. 6a-8b.

The method 1800 may be a method for preparing or manufacturing a pressure sensor (e.g. the pressure sensor 10 discussed above, and/or another pressure sensor above and/or below).

The method 1800 may include at least one step 1810 of preparing a laminate structure 30 or 630 (which may be the lidless structure 30 discussed above or a precursor of the lidless structure 30). However, when manufacturing the pressure sensor(s) 10, the laminate structure 630 may include a plurality of structures 30 for manufacturing a plurality of pressure sensors 10. At the end of step 1810, the structure 30 or 630 may appear as in FIGS. 6a and 6b.

The step 1810 of preparing a laminate structure 30 or 630 may be performed in such a way that the laminate structure 30 or 630 has at least one cavity 62 (e.g., the backspace or chamber 62 above) fluidically communicating with the external environment through an aperture 63. Accordingly, in this step 1810, the laminate structure 30 or 630 is open, and the at least one cavity 62 may be in fluid communication with an external environment. In this step, a circuitry 40 may be applied to the laminate structure 630 or 30, e.g., during lamination (the circuitry 40 may be embedded, e.g., enclosed, in the material of the walls of the structure 630 or 30).

The laminate structure 630 or 30 may be prepared, e.g., by laminating walls (e.g., ceiling walls 31 and 34) so as that they present the precursors 632 and 633 of walls 32 and 33. The precursors 632 and 633 may extend in the planar direction may be integrated in one piece with each other. The precursors 632 and 633 may be adjacent with each other and/or integrated and/or substantially indistinguishable from an external sight. Accordingly, several single structures 30 of the structure 630 appear to have the precursors 632 and 633 adjacent to precursors 633 and 632, respectively, of adjacent structures 30.

The circuitries 40 may be applied to the structures 630. For example, the circuitries 40 may be embedded (e.g., enclosed) in the walls 34 (e.g., during lamination). The cavities 62 and/or the apertures 63 may be obtained, for example, by drilling (e.g., laser or mechanical drill).

According to examples, when preparing, electric connections (e.g., 41-43) may also be prepared. For example, the vias 43 performed on the walls 34 and/or on the one precursor 633. Vias 43 may be obtained, for example, by inserting conductive material after having etched walls (or precursors of walls) of the structure 630 or 30. The planar connections 41a, 42 as well as input/output pads (ports) 45 may be made. (With reference to the example of FIG. 9b, a step may be performed, when preparing the laminate structure, of also preparing the through-holes 63a.)

According to examples (see FIGS. 7a and 7b), there may be provided at least one step 1820 of mounting, from an external side, a chip 20 onto the laminate structure 30 or 630. The chip 20 may include a MEMS device 21. The MEMS device 21 may include the membrane 24, deformable on the basis of external pressure, which may be placed in correspondence to the aperture 63. The MEMS device 21 may also comprise a backplate 25 (e.g., for forming a capacitance with the membrane 24). Accordingly, the membrane 24 may be an element which closes the internal environment 62.

The chip 20 may be connected, for example, through flip-chip connections, e.g., by bumping terminals of the chip 20 and/or terminals 41a on the structure 30, so as to electrically and/or mechanically connect the flip-chip to the other parts of the pressure sensor 10 to be manufactured. (With reference to the example of FIG. 15, in the step of mounting the chip 20 on the structure 30, there may be a step of performing an electric connection through a wire 49, and, when applying the sealing material (which may be glue 22), also covering the wire 49, so that the wire 49 is enclosed in the glue, once solidified.)

According to examples, there may be provided at least one step 1830 (FIGS. 8a and 8b) of applying (e.g., depositing, bonding, gluing, soldering, etc.) sealing material 22 or 1022, so as to obtain a sealed environment 60 within a space delimited by the membrane 24, the sealing material 22, and the laminate structure 30 or 630. Sealing material may be, for example, glue 22 or a film. Once the sealing material is applied, the gas which is internal to the environment cannot flow toward the outside and vice versa, and the fluid communication between the sealed environment 60 and the outside environment is not possible. Notably, when the sealing material is the film 1022 (see FIGS. 10-12), the laser cutting (e.g., laser drilling) may be performed for obtaining the flip opening ports 1050.

When the structure is the structure 630 formed by multiple structures 30, the structure 630 may therefore be singulated. For example, the laminate structure 630 may be sawed, e.g., in correspondence to the adjacent wall precursor 632, 633. By singulating the structure 630 into multiple structures 30, the walls 32 and 33 of the structure 30 are obtained. Further, the different pressure sensors 10 are obtained.

With reference to the example of FIGS. 10-12, in the step 1830 of applying the sealing material may include the step of applying a film 1022 on the structure 1033 (see above), and, in case, laser cutting to obtain the flip openings 1050.

Examples above have been explained as being directed to pressure sensors, such as microphones and acoustic transducers (e.g., MEMS microphones and acoustic transducers). The circuitry 40 may be configured to provide the pressure measurement information by transducing waves of acoustic pressure(s) (e.g., sound, ultrasound, etc.) into an electric signal. The electric signal may be output (e.g., though pads 45) and transmitted (e.g., via an antenna or a wired connection) and/or stored in a storage unit. The electric signal may therefore be used (e.g., by a loudspeaker) for reproducing sound at a remote position and/or at a subsequent time instant.

Examples above may be embodied by MEMS components to obtain MEMS pressure sensors, such as MEMS microphones and MEMS acoustic transducers. For example, in any of the examples above, the chips 20 may be MEMS chips, and/or the membrane 24 may be a MEMS membrane (and may be part of the MEMS device 21).

Examples above may attain several advantages.

For example, there is no need for making a lid to be applied to the lateral walls of the structure. Reference can be made to FIG. 4. The glue 22 (or the film 1022) may be applied to an external side 31a of the ceiling wall 31 which presents a clearly much larger extension than the extension of the than the walls 32 and 33 n the thickness planar, radial direction. Hence, with the present examples, it is extremely easy to apply the glue. (To the contrary, it would be difficult to apply a lid onto the walls 32 and 33: glue should be placed on the lid only in correspondence of the small extension of the walls 32 and 33, which would be difficult and would result into a breakable structure.)

Further, the extension in the planar, radial direction is reduced, e.g., when the circuitry 40 is applied to the floor wall 34 or to a wall which is different from the ceiling wall 31.

Further, by avoiding the lid, it is also possible to use the lateral wall(s) (e.g., 33) for vias which may permit to have internal conductors 43, hence maximizing the use of the space.

The use of flip-chip connections may permit to have good mechanical and electrical connections.

When a wire 49 is used (see FIGS. 15 and 16a), the wire 49 may be easily covered by the glue, which, when solidified, provides good insulation and mechanical protection.

The application of the film 1022 may be easily performed and the film 1022 may be easily cut with laser cutting (drilling).

What is claimed is:

1. A pressure sensor comprising:
   a lidless structure defining an internal chamber for a sealed environment and presenting an aperture;
   a chip including a membrane deformable from external pressure, the chip being mounted outside the lidless structure in correspondence to the aperture so that the membrane closes the sealed environment; and
   circuitry configured to provide a pressure measurement information based on the deformation of the membrane,
   wherein the chip and the circuitry are placed at different walls of the lidless structure.

2. The pressure sensor of claim 1, wherein the chip is mechanically connected to the lidless structure through a flip-chip connection, to electrically connect the chip to the circuitry.

3. The pressure sensor of claim 1, wherein the chip is bonded to the lidless structure so as to prevent a fluid communication between the sealed environment and an external environment.

4. The pressure sensor of claim 3, wherein the chip is bonded to the lidless structure by glue occupying an interspace between the chip and the lidless structure.

5. The pressure sensor of claim 3, wherein the chip is bonded to the lidless structure by a film externally applied to the chip.

6. The pressure sensor of claim 1, wherein the aperture is in an aperture wall integrated in one piece with the lidless structure.

7. The pressure sensor of claim 1, wherein the chip comprises a microelectromechanical system, MEMS, device which includes the membrane.

8. The pressure sensor of claim 1, further configured as a microphone or acoustic transducer, wherein the circuitry is configured to transduce an acoustic pressure into an electric signal.

9. A method for manufacturing at least one pressure sensor, the method comprising:
   preparing a laminate structure with a cavity fluidically communicating with an external environment through an aperture, so that the laminate structure has circuitry applied thereto;
   mounting, from an external side, a chip onto the laminate structure in correspondence to the aperture, the chip including a membrane deformable from external pressure, the membrane closing an internal environment of the cavity; and
   applying sealing material so as to obtain a sealed environment within a space delimited by the membrane, the sealing material, and the laminate structure.

10. The method of claim 9, wherein the laminate structure is subdivided into a plurality of structures, the method being so as to configure each structure as presenting a cavity and an aperture and having a chip and circuitry mounted thereon, wherein the laminate structure includes different structures having adjacent wall precursors integral with each other, the method further comprising:

singulating the plurality of structures by cutting the laminate structure in correspondence of the adjacent wall precursors so as to form walls of the structure.

11. The method of claim 9, wherein mounting includes mechanically connecting the chip to the laminate structure in a flip-chip connection, to electrically connect the chip to the circuitry.

12. The method of claim 9, wherein applying sealing material includes bonding the chip to the laminate structure to prevent a fluid communication between the sealed environment and an external environment.

13. The method of claim 12, wherein applying sealing material includes sealing the chip to the laminate structure by glue, or other sealing material, occupying an interspace between the chip and the laminate structure.

14. The method of claim 12, wherein applying sealing material includes sealing the chip to the laminate structure by externally applying a film to the chip.

15. The method of claim 9, wherein applying sealing material includes applying sealing material on an external surface of a ceiling wall of the laminate structure.

16. A pressure sensor comprising:
a lidless structure defining an internal chamber for a sealed environment and presenting an aperture;
a chip including a membrane deformable from external pressure, the chip being mounted outside the lidless structure in correspondence to the aperture so that the membrane closes the sealed environment;
circuitry configured to provide a pressure measurement information based on the deformation of the membrane; and
a protective mesh cover of a reticular shape applied over the membrane.

* * * * *